(12) United States Patent
Mochida

(10) Patent No.: US 6,424,589 B2
(45) Date of Patent: Jul. 23, 2002

(54) SEMICONDUCTOR MEMORY DEVICE AND METHOD FOR ACCESSING MEMORY CELL

(75) Inventor: Yoshifumi Mochida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/911,120

(22) Filed: Jul. 23, 2001

(30) Foreign Application Priority Data

Jul. 24, 2000 (JP) ........................................ 2000-222979

(51) Int. Cl.[7] ................................................. G11C 8/00
(52) U.S. Cl. ........................... 365/230.06; 365/189.11; 365/204
(58) Field of Search ..................... 365/230.06, 189.11, 365/204; 326/105, 106

(56) References Cited

U.S. PATENT DOCUMENTS 5,970,019 A * 10/1999 Suzuki et al. .......... 365/230.03
6,262,934 B1 * 7/2001 Uehara ................. 365/230.06

* cited by examiner

Primary Examiner—Huan Hoang
(74) Attorney, Agent, or Firm—Darryl G. Walker

(57) ABSTRACT

A semiconductor memory device (10) having a peripheral ground line (GND) receiving charge when discharging a sub-word line (SWL) is provided. The semiconductor memory device (10) can include a row decoder (XDEC1), RA driver (RAD11), and sub-decoder blocks (SB). Row decoder (XDEC1) may activate a main word line (MWL) based on a received address value. RA driver (RAD11) may activate a sub-decoder block (SB) from a group of sub-decoder blocks coupled to the activated main word line (MWL). RA driver (RAD11) may provide a current path (4) to peripheral ground (GND) when the sub-word line (SWL) transitions from the activated state to the unactivated state. Non-selected sub-word lines may have a current path (1, 2, or 3) to a word line ground (GNDXDEC) for holding the other word lines at a "quiet" ground potential. Noise produced from discharging a sub-word line may not affect non-selected word lines.

20 Claims, 12 Drawing Sheets

SEMICONDUCTOR MEMORY DEVICE AND METHOD FOR ACCESSING MEMORY CELL

TECHNICAL FIELD

The present invention relates generally to a semiconductor memory device and more particularly to circuitry for selecting a word line in a memory cell array.

BACKGROUND OF THE INVENTION

In semiconductor devices, increased integration and improved processing techniques have improved operating speeds. As operating speeds of a central processing unit (CPU) increases, it becomes desirable to reduce the time required for reading and writing data to a memory cell of a semiconductor memory device.

A boosted potential can be applied to a word line in order to write, read, or refresh data in a memory cell. This can improve operational speeds by increasing the data signal stored in a memory cell by increasing the amount of charge that can be stored on a storage capacitor. The boosted potential may also increase speeds by decreasing the resistance of a memory cell transistor.

When reading or writing is finished, the potential on the word line is lowered (typically to a ground potential). In order to improve speeds, it is desirable to discharge the word line as quickly as possible, so that a precharge operation can be more quickly executed. This can decrease the memory cell access cycle time.

Referring now to FIG. 1, a block schematic diagram of a conventional DRAM is shown and given the general reference character 10.

Conventional DRAM 10 includes four memory banks (B1 to B4), main word decoders (XDEC1 to XDEC4), RA drivers (RAD1 to RAD5), and sub-word drivers (SWD1 to SWD20).

Main word decoders (XDEC1 to XDEC4) receive row addresses (X2 to Xj) and provide main word lines MWL. For example, main word decoder XDEC1 provides main word lines (MWL00 to MWL0$i$). Main word decoder XDEC2 provides main word lines (MWL10 to MWL1$i$). Main word decoder XDEC3 provides main word lines (MWL20 to MWL2$i$). Main word decoder XDEC4 provides main word lines (MWL30 to MWL3$i$).

A main word line MWL from one of main word decoders (XDEC1 to XDEC4) is selected based on the value of row addresses (X2 to Xj). When selected, a main word line MWL transitions to a high level.

RA drivers (RAD1 to RAD5) receive row addresses (X0 and X1) and control signal RAE and generate sub-word select signals (RA00 to RA42). Sub-word select signals are received by sub-word drivers (SWD1 to SWD20). Sub-word drivers (SWD1 to SWD20) then select a sub-word line (not shown in FIG. 1) in each bank (B1 to B4) based on the selected main word line MWL and sub-word select signals (RA00 to RA42) selected.

Each memory bank (B1 to B4) includes four cell arrays (CELL0 to CELL15) and five sense amplifier rows (SA0 to SA19). Bank B1 includes cell arrays (CELL0 to CELL3) and sense amplifier rows (SA0 to SA4). Bank B2 includes cell arrays (CELL4 to CELL7) and sense amplifier rows (SA5 to SA9). Bank B3 includes cell arrays (CELL8 to CELL11) and sense amplifier rows (SA10 to SA14). Bank B4 includes cell arrays (CELL12 to CELL15) and sense amplifier rows (SA15 to SA19).

When receiving a high sub-word select signal (RA00 to RA42) and a high main word line MWL, a sub-word driver (SWD1 to SWD20) selects a sub-word line (not shown) in an adjacent cell array, such that a cell array in each bank has an active sub-word line during an activation cycle.

Sub-word drivers (SWD5 to SWD16) select a sub-word line in two adjacent cell arrays. For example, sub-word driver SWD5 selects a sub-word line in both cell array (CELL0 and CELL4) when one of main word lines (MWL00 to MWL0$i$) is high (activated) and one of RA signals (RA11 and RA13) is high (activated).

Sub-word drivers (SWD1 to SWD20) include end sub-word drivers (SWD1 to SWD4 and SWD17 to SWD20) that select a sub-word line in the adjacent end cell array. For example, sub-word driver SWD1 selects a sub-word line in cell array CELL0 when one of main word lines (MWL00 to MWL0$i$) is high (activated) and one of RA signals (RA00 and RA02) is high (activated).

When row addresses (X1 and X0) have the value {low, low} respectively, RA signals (RA00, RA20, and RA40) become high, while other RA signals remain low. Assuming, main word decoder XDEC1 has received a row address (X2 to Xj) that activates one of main word lines (MWL00 to MWL0$i$), a sub-word line in cell array CELL0 is activated by sub-word decoder SWD1, a sub-word line in cell arrays (CELL4 and CELL8) is activated by sub-word decoder SWD9, and a sub-word line in cell array CELL12 is activated by sub-word decoder SWD17.

When row addresses (X1 and X0) have the value {low, high} respectively, RA signals (RA11 and RA31) become high, while other RA signals remain low. Assuming, main word decoder XDEC1 has received a row address (X2 to Xj) that activates one of main word lines (MWL00 to MWL0$i$), a sub-word line in cell arrays (CELL0 and CELL4) is activated by sub-word decoder SWD5, and a sub-word line in cell arrays (CELL8 and CELL12) is activated by sub-word decoder SWD13.

When row addresses (X1 and X0) have the value {high, low} respectively, RA signals (RA02, RA22, and RA42) become high, while other RA signals remain low. Assuming, main word decoder XDEC1 has received a row address (X2 to Xj) that activates one of main word lines (MWL00 to MWL0$i$), a sub-word line in cell array CELL0 is activated by sub-word decoder SWD1, a sub-word line in cell arrays (CELL4 and CELL8) is activated by sub-word decoder SWD9, and a sub-word line in cell array CELL12 is activated by sub-word decoder SWD17.

When row addresses (X1 and X0) have the value {high, high} respectively, RA signals (RA13 and RA33) become high, while other RA signals remain low. Assuming, main word decoder XDEC1 has received a row address (X2 to Xj) that activates one of main word lines (MWL00 to MWL0$i$), a sub-word line in cell arrays (CELL0 and CELL4) is activated by sub-word decoder SWD5, and a sub-word line in cell arrays (CELL8 and CELL12) is activated by sub-word decoder SWD13.

In this way, one cell array (CELL0 to CELL15) is selected in each bank (B1 to B4). Sense amplifier rows (SA0 to SA19) adjacent to selected banks detect data values stored in memory cells connected to the selected sub-word lines. For example, if cell arrays (CELL0, CELL4, CELL8, and CELL12) are selected, respective adjacent sense amplifier rows will sense the data values in the selected memory cells. Sense amplifier rows (SA0 and SA1) sense data from cell array CELL0. Sense amplifier rows (SA5 and SA6) sense data from cell array CELL4. Sense amplifier rows (SA10 and SA11) sense data from cell array CELL8. Sense amplifier rows (SA15 and SA16) sense data from cell array CELL12.

Although in FIG. 1, RA drivers (RAD1 to RAD5) are shown to output RA signals (RA00 to RA42), complementary RA signals (RAB00 to RAB42) are also generated, but not shown to avoid unduly cluttering the figure.

Referring now to FIG. 2, a block schematic diagram of a portion of conventional DRAM 10 is set forth.

The portion of conventional DRAM 10 includes a portion of cell array CELL0, sub-word decoders (SWD1 and SWD5), and sense amplifier rows (SA0 and SA1).

Each sub-word decoder (SWD1 and SWD5) includes a plurality of sub-decoder blocks SB. For example, sub-word decoder SWD1 includes sub-decoder blocks (SB0000 to SB0i02). RA-drivers (RAD1 and RAD2) generate RA signals (RA00 to RA03) that select predetermined sub-decoder blocks SB.

Cell array CELL0 includes a plurality of memory cells arranged in rows and columns. Each memory cell is connected to receive a sub-word line SWL. Each memory cell is connected to a bit line BT. Two examples of memory cells are illustrated as memory cells (M1 and M2) which are connected to sub-word line SWL0000. Memory cells (M1 and M2) include a memory cell transistor and a memory cell capacitor. The memory cell transistor is an n-type insulated gate field effect transistor (IGFET). Each memory cell capacitor has one terminal connected to a predetermined potential, such as ground or ½ Vcc, as just two examples, and another terminal connected to a source of the memory cell transistor. Each memory cell transistor has a gate connected to a sub-word line SWL and a drain connected to a bit line BT.

The quantity of charge stored on the memory cell capacitor determines the logic level of the data stored. Data is written to or read from a memory cell by turning on the memory cell transistor and electrically connecting a bit line BT to a memory cell capacitor to transfer charge to or from the memory cell capacitor.

Bit line pairs are connected to a sense amplifier. For example, bit lines (BT1 and BT2) form one bit line pair connected to sense amplifier SA1.

Each main word line (MWL00 to MWL0i) is connected to two sub-decoder blocks SB in each row of sub-word decoder (SWD1, SWD5, . . . ). Each sub-decoder blcok SB is connected to drive a sub-word line SWL in each adjacent cell array CELL. For example, sub-decoder SB0000 is connected to drive sub-word line SWL0000 within cell array CELL0. However, sub-decoder block SB0001 is connected to drive sub-word line SWL0001 within cell array CELL0 and also connected to drive a sub-word line in cell array CELL4.

Sub-decoder blocks (SB0000 to SB0003) are all connected to receive main word line MWL00. RA-drivers (RAD1 and RAD2) collectively select only one of sub-decoder blocks (SB0000 to SB0003). Thus, when main word line MWL00 is activated, one of sub-word lines (SWL0000 to SWL0003) will be selected based which one of RA signals (RA00 to RA03) is activated. In this way, each main word line MWL is selectively connected to drive one of four sub-word lines SWL in each cell array CELL. Thus, there are four times more sub-word lines SWL within a cell array CELL than there are main word lines MWL connected to sub-word drivers SWD adjacent to a cell array CELL.

It is understood that only a few main word lines MWL, sub-word lines SWL, memory cells (M1 and M2), bit lines BT, sub-decoder blocks SB, and sense amplifiers SA are illustrated in FIG. 2 to avoid unduly cluttering the figure.

Other cell arrays CELL and sub-word decoders SWD illustrated in FIG. 1, are constructed in generally the same manner as illustrated in FIG. 2.

A y-selector circuit (not illustrated) can be used to select a sense amplifier SA to provide a data path between a cell array CELL and an external data pin (not shown). A y-selector receives a column address and selects a sense amplifier SA based on the column address value.

Referring now to FIG. 3, a circuit schematic diagram of a sub-decoder block is set forth and given the general reference character SB.

Sub-decoder block SB includes transistors (T1 to T4). Transistors (T1 to T4) are n-type IGFETs. Sub-decoder block SB can be used as sub-decoder block SB0000 in FIG. 2.

Transistor T1 has a source connected to receive main word line MWL00, a drain connected to a gate of transistor T2 at node A, and a gate connected to power supply potential. Transistor T2 has a drain connected to RA signal RA00 and a source connected to sub-word line SWL0000 at node B. Transistor T3 has a source connected to receive main word line MWL00, a drain connected to sub-word line SWL0000 and a gate connected to receive RA signal RA00. Transistor T4 has a drain connected to sub-word line SWL0000, a source connected to ground, and a gate connected to receive complementary RA signal RAB00.

When at a logic high, the potential levels of RA signal RA00 and complementary RA signal RAB00, main word line MWL00 are boosted supply potentials. Likewise, the power supply potential connected to the gate of transistor T1 is a boosted power supply potential.

Sub-decoder blocks SB within sub-word decoders (SWD1 to SWD5) illustrated in FIG. 2 have generally the same structure as sub-decoder block SB illustrated in FIG. 3.

Referring now to FIG. 4, a timing diagram illustrating the operation of sub-decoder block SB is set forth.

The timing diagram of FIG. 4 illustrates the operation of sub-decoder block SB0000 when memory cell M1 of FIG. 2 is accessed. The timing diagram includes row address XADD, main word line MWL00, control signal RAE, RA signal RA00, complementary RA signal RAB00, voltage at node A, and sub-word line SWL0000.

Initially main word line MWL00, control signal RAE, and RA signal RA00 are low. Complementary RA signal RAB00 is high. With complementary RA signal RAB00 high, transistor T4 is turned on and sub-word line SWL0000 is maintained at a low potential.

At time t100, row address XADD may transition to a value that causes row decoder XDEC1 to activate main word line MWL00. At time t101, row decoder XDEC1 activates main word line MWL00 and main word line MWL00 transitions to a high level.

Because transistor T1 is turned on the voltage at node A follows the voltage on main word line MWL00.

At time t103, control signal RAE transitions high. This allows RA-driver RAD1 to drive RA signal RA00 to a high level and complementary RA signal RAB00 to a low level. The states of RA signal RA00 and complementary RA signal RAB00 are determined by values of row addresses (X0 and X1).

Transistor T1 operates to allow transistor T2 to be self-booting. Transistor T1 allows the gate of transistor T2 to receive a high potential prior to RA signal RA00 transitioning high. Thus, at time t103, when RA signal RA00 transitions high, the gate capacitance of transistor T2 couples the rising potential of RA signal RA00 to node A. Thus, node A potential rises along with the RA signal RA00. As the potential at node A rises to within a threshold voltage of the gate potential of transistor T1, transistor T1 turns off and node A remains booted to a high potential. This allows transistor T2 to pass the full potential of RA signal RA00 to sub-word line SWL0000.

Because complementary RA signal RAB00 is low at this time, transistor T4 is turned off. On other sub-decoder blocks SB within sub-word decoders (SWD1 to SWD4) that receive RA signal RA00 and complementary RA signal RAB00, it is necessary to provide a conductive path from unselected sub-word lines SWL to ground. Transistor T3 serves this function. When RA signal RAB00 transitions high, transistor T3 provides a path to ground when the corresponding main word line MWL is low. This prevents unselected sub-word lines SWL from floating.

After data is read or written to the addressed memory cell M1, control signal RAE returns low. Control signal RAE or row address enable has a predetermined pulse width based on the time required to read or write data from a selected memory cell. This is illustrated at time t104 in FIG. 4.

RA-driver RAD1 receives the low control signal RAE, which causes RA signal RA00 to return low and complementary RA signal RAB00 to return high. With RAB00 high, transistor T4 is turned on and sub-word line SWL0000 is discharged to ground. At the same time, the potential at node A falls along with the potential of RA signal RA00. This is illustrated at time t104 in FIG. 4. It is noted that transistor T2 is on when RA signal RA00 transitions low. Thus, sub-word line is also discharged through transistor T2 by way of RA signal RA00.

Subsequently, at time t106, row address XADD can change and main word line MWL00 transitions low. Because transistor T1 is on, the potential at node A follows main word line MWL00 to a low level, such as ground.

The current paths for discharging a sub-word line SWL when transitioning from selected to unselected will now be explained.

Referring now to FIG. 5, a circuit schematic diagram of a sub-decoder block SB is set forth. Sub-decoder block SB illustrates three current paths through which charge can be removed from sub-word line SWL0000.

Current path 1 illustrates current flowing from sub-word line SWL0000 through transistor T4 to ground. Current path 2 illustrates current flowing from sub-word line SWL0000 through transistor T2 to RA signal RA00. Current path 3 illustrates current flowing from sub-word line SWL0000 through transistor T3 to main word line MWL00.

Referring now to FIG. 6, a timing diagram of illustrating signals for sub-decoder block SB when the sub-word line SWL is in a non-selected state is set forth.

The timing diagram of FIG. 6 includes main word line MWL00, RA signal RA00, complementary RA signal RAB00, potential at node A, and sub-word line SWL0000.

In the non-selected state, main word line MWL00 and RA signal RA00 are both low. Complementary RA signal RAB00 is high.

With main word line MWL00 low, the potential at node A is also low. With the potential at node A low, transistor T2 is turned off. With RA signal RA00 low, transistor T3 is turned off. Thus, current paths (2 and 3) of FIG. 5 are disabled.

However, with complementary RA signal RAB00 high, transistor T4 is turned on, and a conduction path to ground is formed through transistor T4. Thus, the current path 1 of FIG. 5 is enabled. Any charge removed from sub-word line SWL0000 goes through current path 1.

In this case, transistor T4 may only be used to keep sub-word line SWL0000 at a ground level. Thus, under these conditions, transistor T4 does not need to sink a large amount of current and can therefore be a relatively small device.

Referring now to FIG. 7, a timing diagram of illustrating signals for sub-decoder block SB when the sub-word line is in a non-selected state is set forth.

The timing diagram of FIG. 7 includes main word line MWL00, RA signal RA00, complementary RA signal RAB00, potential at node A, and sub-word line SWL0000.

In the non-selected state, RA signal RA00 is low. Complementary RA signal RAB00 is high. However, main word line MWL00 transitions from low to high at time t200 and returns low at time t201. With transistor T1 turned on, the potential at node A generally follows main word line MWL00.

Before time t200, any charge removed from sub-word line SWL0000 goes through current path 1 as illustrated in FIG. 5. However, between the times t200 and t201, transistor T2 turns on. Thus, from time t200 to time t2001, charge removed from sub-word line SWL0000 goes through current paths (1 and 2) as illustrated in FIG. 5.

Referring now to FIG. 8, a timing diagram of illustrating signals for sub-decoder block SB when the sub-word line is in a non-selected state is set forth.

The timing diagram of FIG. 8 includes main word line MWL00, RA signal RA00, complementary RA signal RAB00, potential at node A, and sub-word line SWL0000.

In the non-selected state main word line MWL00 is low. Because main word line MWL00 is low, the potential at node A remains low and transistor T2 remains turned off. However, RA signal RA00 transitions from low to high at time t202 and returns low at time t203. Likewise, complementary RA signal RAB00 transitions from high to low at time t202 and returns high at time t203.

Before time t202, any charge removed from sub-word line SWL0000 goes through current path 1 as illustrated in FIG. 5.

However, with complementary RA signal RAB00 low between times t202 and t203, transistor T4 is turned off which disables current path 1 as illustrated in FIG. 5. With RA signal RA00 high between times t202 and t203, transistor T3 is turned on. Because main word line MWL00 is low during this time, any charge removed from sub-word line SWL0000 goes through current path 3 as illustrated in FIG. 5.

At time t203, complementary RA signal RAB00 returns high and RA signal RA00 returns low. Thus, after time t203, any charge removed from sub-word line SWL0000 goes through current path 1 as illustrated in FIG. 5.

Referring now to FIG. 9, a circuit schematic diagram illustrating portions of circuits used to activate sub-word lines SWL is set forth.

It can be seen that a buffer BF0 is used to drive main word line MWL00. Buffer BF0 is made up of two inverters including complementary IGFETs (n-type and p-type). Buffer BF0 includes a transistor TB0 to pull main word line MWL00 low. Transistor TB0 is an n-type IGFET. Thus, in the time between time t202 and t203 illustrated in FIG. 8, the charge removed from sub-word line SWL0000 going through current path 3 as illustrated in FIG. 5, also goes through transistor TB0 in buffer BF0.

It is noted in FIG. 9 that in the conventional approach, buffers (BF0, BF1, . . . ), RA drivers RAD, and sub-decoder blocks SB receive the word line ground potential GNDX-DEC to provide a low potential to unselected sub-word lines SWL.

Referring now to FIG. 10, a circuit schematic diagram of an RA driver is set forth.

RA driver in FIG. 10, illustrates RA driver RAD1A which generates RA signal RA00 and complementary RA signal RAB00. Also illustrated is RA driver RAD1B, which generates RA signal RA02 and complementary RA signal RAB02. Reference characters for RA driver RAD1B are illustrated in parenthesis. Collectively, RA drivers (RAD1A and RAD1B) make up RA driver RAD1 illustrated in FIGS. 1 and 2.

RA driver RAD1A includes decoder 100, AND gate 101, inverters (102 and 103), and transistors (104 and 105). Decoder 100 receives row addresses (X0 and X1) as inputs and generates an output received at an input of AND gate 101. AND gate 101 receives control signal RAE at another input and provides an output to the inputs of inverters (102 and 103). Inverter 103 provides complementary RA signal RAB00 as an output. Inverter 102 provides an output to the gates of transistors (104 and 105). Transistor 104 has a source connected to a boosted power supply potential and a drain connected to RA signal RA00. Transistor 105 has a source connected to a word line ground potential GNDX-DEC and a drain connected to RA signal RA00. Transistor 104 is a p-type IGFET. Transistor 105 is an n-type IGFET.

A peripheral ground potential GND is connected as a ground for decoder 100, AND gate 101, and inverters (102 and 103).

When control signal RAE is low, the output of AND gate 101 is low. With the output of AND gate 101 low, RA signal RA00 is low and complementary RA signal RAB00 is high.

When control signal RAE is high, and row addresses (X1, X0) are in a select state, which for decoder 100 of RA driver RAD1A is {low, low}, then the output of decoder 100 becomes high. With the output of decoder 100 high and control signal RAE high, the output of AND gate 101 becomes high. With the output of AND gate 101 high, RA signal RA00 is high and complementary RA signal RAB00 is low. If decoder 100 of RA driver RAD1A receives row addresses (X1, X0) having a value other than {low, low}, then the output of decoder 100 is low, RA signal RA00 is low, and complementary RA signal RAB00 is high.

In order to sink sufficient current to discharge RA signal RA00, transistor 105 needs to be relatively large as compared to other transistors.

RA driver RAD1B operates in the same general manner as RA driver RAD1A except decoder 100' is enabled and outputs a logic high when row addresses (X1, X0) have the value of {low, high}, respectively.

Other decoders (RAD2, RAD3, RAD4, and RAD5) have similar circuit construction to RA driver RAD1.

Peripheral ground GND and word line ground GNDX-DEC are connected to the same ground pad through separate wirings. Variations of the potential on the separate grounds are isolated with the aid of wiring resistance R1 and wiring resistance R2 of the respective wirings. This can prevent noise on the respective wirings from being transmitted between the separate grounds.

Current paths and ground noise during sub-word line switching will now be illustrated with reference to FIG. 11 in conjunction with FIG. 9.

Referring now to FIG. 11, a timing diagram illustrating current paths for transferring charge to and from a sub-word line is set forth.

The timing diagram of FIG. 11 illustrates current paths from sub-word lines SWL when selected and unselected.

The timing diagram of FIG. 11 includes row address XADD, main word line MWL00, control signal RAE, RA signal RA00, complementary RA signal RAB00, sub-word line SWL0000, sub-word line SWL0002, sub-word line SWL0100, and sub-word line SWL0102. Also illustrated is a blown up portion around time t304, illustrating a selected sub-word line SWL0000 and word line ground potential GNDXDEC.

The timing diagram of FIG. 11 illustrates selected signals in the circuit schematic diagram of FIG. 9.

In the timing diagram of FIG. 11, sub-word line SWL0000 changes from the unselected state (low) to the selected state (high) and back to the unselected state, while the other illustrated sub-word lines (SWL0002, SWL0100, and SWL0102) remain in the unselected state.

Initially main word lines (MWL00 and MWL01) are low. RA signals (RA00 and RA02) are also low. Complementary RA signals (RAB00 and RAB02) are high. As illustrated in FIG. 11, before time T300, each sub-word line (SWL0000, SWL0002, SWL0100, and SWL0102) is held at a low level by way of respective current paths 1 (FIG. 5) within their respective sub-decoder block SB.

At time t300, row address XADD changes to a value to select sub-word line SWL0000. Referring to FIG. 9, a high potential at a boosted voltage level is input from row decoder XDEC1 to the input of buffer BF0. After a propagation delay, at time t301, main word line MWL00 transitions to a high level. The high level is a boosted voltage level.

At time t301, because main world line MWL00 becomes high, the potential at node A of sub-decoder blocks (SB0000 and SB0002) becomes high. With RA signals (RA00 and RA02) low, current paths 2 within sub-decoder blocks (SB0000 and SB0002) are enabled to hold sub-word lines (SWL0000 and SWL0002), respectively, low. Thus, both current paths (1 and 2) are enabled in sub-decoder blocks (SB0000 and SB0002) at time t301. However, for sub-decoder blocks (SB0100 and SB0102), only current path 1 is enabled.

At time t302, a control circuit (not shown) places control signal RAE in an enable state (transitions from low to high). Time t302 can be determined by a predetermined delay from the row address XADD change. RA driver RAD1 brings RA signal RA00 to a high level and complementary RA signal RAB00 to a low level.

As a result, at time t303, sub-word line SWL0000 is activated by sub-decoder block SB0000. When activated, sub-word line SWL0000 rises to a boosted potential. Sub-word line SWL0000 turns on the memory cell transistor of memory cell M1 and data stored on the memory cell capacitor is transferred to bit line BT2.

Because RA signal RA02 remains low, current paths (1 and 2) remain enabled within sub-decoder block SB0002.

However, when RA signal RA00 becomes high, transistor T3 within sub-decoder block SB0100 is turned on and current path 3 becomes enabled. Thus, sub-word line SWL0100 is held low by current path 3 through transistor T3 within sub-decoder block SB0100 and transistor TB0 within buffer BF1.

At time t304, a control circuit (not shown) places control signal RAE in a disable state (transitions from high to low). The time between times t302 and t304 can be determined by a predetermined delay indicating the maximum time required to access data in a memory cell. RA driver RAD1 brings RA signal RA00 to a low level and complementary RA signal RAB00 to a high level.

Thus, charge is drawn from sub-word line SWL0000 to bring the potential of sub-word line SWL0000 from a high boosted potential to ground or low. Because main word line MWL00 is high at time t304 and RA signal RA00 becomes low, current path 2 within sub-decoder block SB0000 is enabled. Also, because complementary RA signal RA00 becomes high at time t304, current path 1 within sub-decoder block SB0000 is enabled. Thus, sub-word line SWL0000 is discharged through current paths (1 and 2) within sub-decoder block SB0000 at time t304.

At time t304, the status of sub-decoder blocks (SB0002 and SB0102) remains unchanged. Current paths (1 and 2) within sub-decoder block SB0002 and current path 1 within sub-decoder block SB0102 remain enabled. However, when RA signal RA00 transitions low, current path 3 within sub-decoder block SB0100 becomes disabled. When complementary RA signal RAB00 transitions high, current path 1 within sub-decoder block SB0100 becomes enabled. Thus, sub-word line SWL0100 is held low by current path 1 within sub-decoder block SB0100 at time t304.

In order to improve cycle times of accessing a memory cell, the transistors in the discharge path of a sub-word line SWL are made relatively large. A sub-word line is connected to control gates of a very large number of memory cell transistors, thus it has a large capacitance. When sub-word line SWL0000 goes from the selected state to the unselected state at time t304, a large amount of current flows through current paths (1 and 2) to word line ground potential GNDXDEC. Also, RA signal (RA00 and RA02) are routed the length of a cell array CELL and are connected to diffusion regions (source/drain connections) of transistor T2 and gates of transistor T3 within a large number of sub-word decoders SB. Thus, the capacitance of RA signals (RA00 and RA02) is very large. This further increases the instantaneous current flowing to word line ground potential GNDXDEC.

Referring to FIG. 11, there is a blown up section illustrating sub-word line SWL0000, RA signal RA00, word line ground potential GNDXDEC, and non-selected sub-word lines (SWL0001, SWL0002, and SWL0003). When a large current flows to word line ground potential GNDXDEC, a noise bump can be induced due to the resistance of the signal carrying conductor. In this case, because word line ground potential GNDXDEC is holding non-selected sub-word lines low (through current path 1 or current paths 1 and 2), the noise bump can be transmitted on non-selected sub-word lines (for example, SWL0001, SWL0002, and SWL0003). This can cause unwanted leakage from memory cells connected to these non-selected sub-word lines and can compromise stored data. Although only sub-word lines (SWL0001, SWL0002, and SWL0003) are illustrated, other sub-word lines may have unwanted noise because they may be held to a low level by current flowing to word line ground potential GNDXDEC.

The purpose of providing a separate word line ground potential GNDXDEC from a peripheral ground potential is to eliminate unwanted noise on unselected word lines. In this case, this purpose may not be achieved.

One method of solving this problem is to increase the width of the wiring carrying word line ground potential GNDXDEC. This can reduce resistance and increase current carrying capability. However, this must be done for each memory block on the chip and can result in an increase in chip size, thus increasing production costs.

Another approach for solving this problem is to use a material with a reduced sheet resistance for the wiring carrying word line ground potential GNDXDEC. However, this can require a change in the fabrication process, which requires process developmental costs and costs for testing the design. This increases overall fabrication costs, thus increasing per chip costs of manufacturing.

In view of the above discussion, it would be desirable to provide a semiconductor memory device that may be capable of discharging a sub-word line at a high speed. It would also be desirable to reduce adverse effects such as memory cell leakage caused by discharging a sub-word line. It would be desirable to provide this while not increasing chip size as compared to conventional approaches.

SUMMARY OF THE INVENTION

According to the present embodiments, a semiconductor memory device having a peripheral ground line receiving charge when discharging a sub-word line is provided. The semiconductor memory device can include a row decoder, RA driver, and sub-decoder blocks. The row decoder may activate a main word line based on a received address value. RA driver may activate a sub-decoder block from a group of sub-decoder blocks coupled to the activated main word line. RA driver may provide a current path to the peripheral ground when the sub-word line transitions from the activated state to the unactivated state. Non-selected sub-word lines may have a current path to a word line ground for holding the other word lines at a "quiet" ground potential. Noise produced from discharging a sub-word line may have a reduced affect on non-selected sub-word lines.

According to one aspect of the embodiments, a semiconductor memory device may include a plurality of word lines. Each word line may be connected to a plurality of memory cells. A decoder circuit may be coupled to a predetermined word line. The decoder circuit may provide an electrical connection between a first ground line and the predetermined word line when the predetermined word line is not selected. The decoder circuit may provide an electrical connection between a second ground line and the predetermined word line when the predetermine word line is deactivated.

According to another aspect of the embodiments, the decoder circuit may include a first transistor providing an electrical connection between the predetermined word line and the first ground line and a second transistor providing the electrical connection between the predetermined word line and the second ground line.

According to another aspect of the embodiments, the current capacity of the second transistor may be larger than the current capacity of the first transistor.

According to another aspect of the embodiments, the second transistor may be an insulated gate field effect transistor (IGFET).

According to another aspect of the embodiments, when the predetermined word line is deactivated, the second transistor may be controlled with a boosted potential.

According to another aspect of the embodiments, the plurality of word lines may include a plurality of main word lines. Each main word line may be divided into a plurality of sub-word lines. The decoder circuit may provide the electrical connections between the first and second ground lines and a predetermined sub-word line.

According to another aspect of the embodiments, a value of an internal row address may activate the predetermined word line. The predetermined word line may be deactivated prior to a subsequent change in the value of the internal row address.

According to another aspect of the embodiments, a semiconductor memory device may include a first word line having an activated state and an unactivated state. A second word line may have an activated state and an unactivated state. A decoder circuit may provide a discharge current path to a first ground line when the first word line transitions from the activated state to the unactivated state. The decoder circuit may provide a holding current path to a second ground line when the second word line is in the activated state.

According to another aspect of the embodiments, the decoder circuit may receive a control signal having a discharge current path enable state and a discharge current path disable state. When the first word line is in the activated state, the control signal may be in the discharge current path disable state.

According to another aspect of the embodiments, the holding current path may be disabled when the control signal is in the discharge current path enable state.

According to another aspect of the embodiments, a first control signal may have an enable state and a disable state. The decoder circuit may include an address decode portion. The address decode portion may provide a decode signal having a decode select state when a received address has a predetermined value and a decode unselected state when the received address does not have the predetermined value. The holding current path may be disabled when the first control signal has the enable state and the decode signal has the first decode state.

According to another aspect of the embodiments, the discharge current path may be disabled when the decode signal has the decode unselected state.

According to another aspect of the embodiments, a second control signal may have a second control enable state and a second control disable state. The discharge current path may be enabled when the second control signal has the second control signal enable state and the decode signal has the decode enable state.

According to another aspect of the embodiments, a method for accessing a memory cell of a semiconductor memory device may include the steps of: activating a first word line electrically connected with a gate of an access transistor of a memory cell, keeping a second word line unactivated by providing a first holding current path to a first ground line, and deactivating the first word line by providing a first discharge current path to a second ground line.

According to another aspect of the embodiments, the first holding current path may have a smaller current capacity than the first discharge current path.

According to another aspect of the embodiments, the first word line may have a second holding current path when unactivated. When the first discharge current path is enabled, the second holding current path may be disabled.

According to another aspect of the embodiments, the first discharge current path may include an insulated gate field effect transistor (IGFET). The IGFET may have an impedance path coupled between the first word line and the second ground line.

According to another aspect of the embodiments, deactivating the first word line may include applying a boosted voltage to the gate of the IGFET.

According to another aspect of the embodiments, the step of activating a first word line may include activating a first main word line coupled to a first group of word lines and activating the first word line from the first group of word lines.

According to another aspect of the embodiments, the step of activating the first word line may include internally receiving a row address. The step of deactivating the first word line is prior to internally receiving a subsequent row address.

DETAILED DESCRIPTION OF THE EMBODIMENTS

Various embodiments of the present invention will now be described in detail with reference to a number of drawings.

Figure 12:
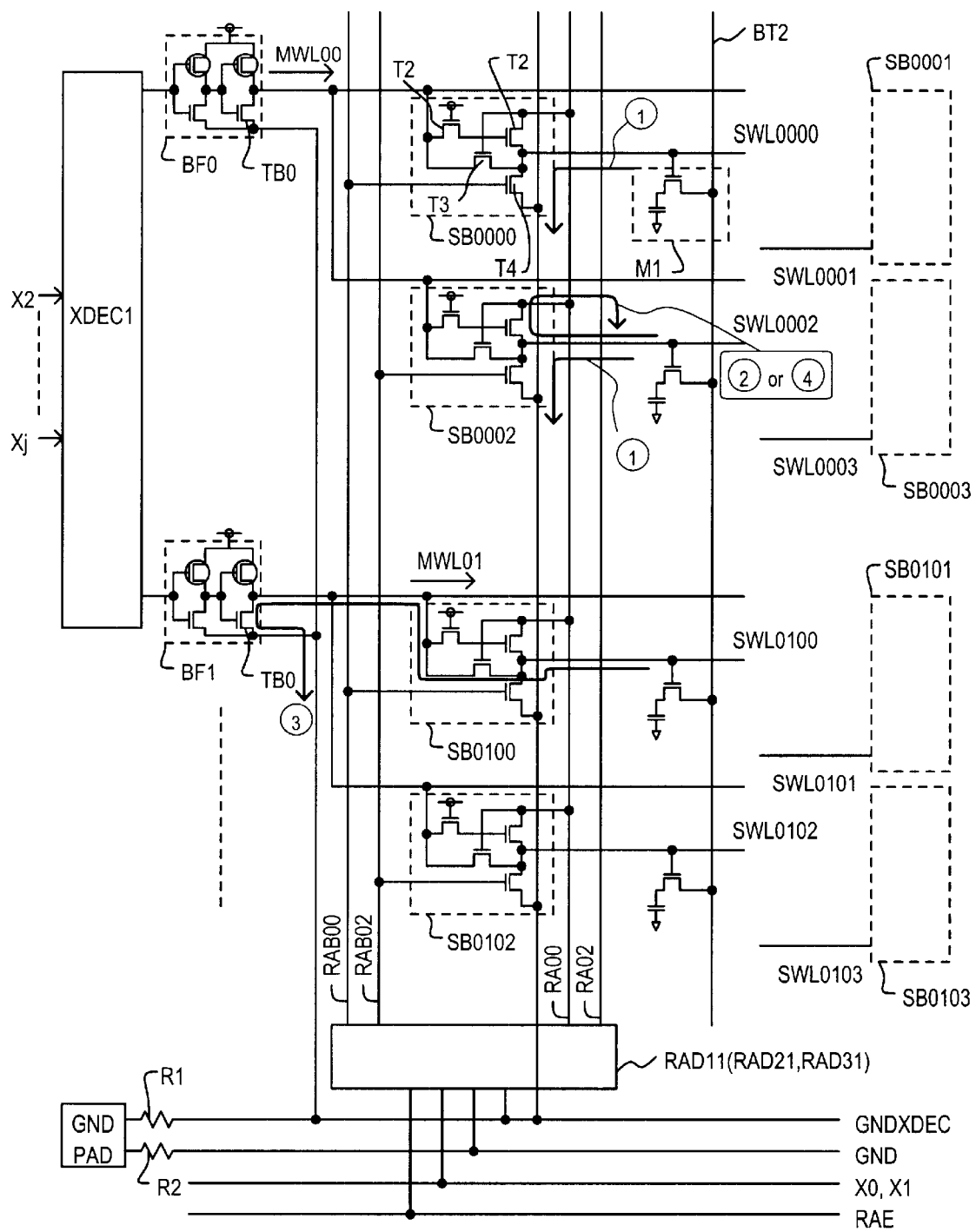
FIG. 12 is a circuit schematic diagram of portions circuits used to activate sub-word lines according to one embodiment.
Figure 13:
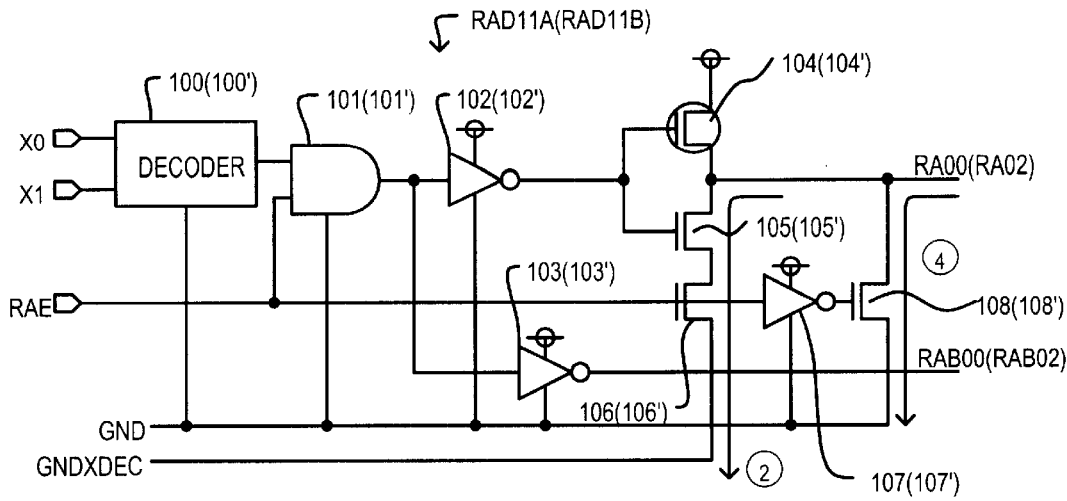
FIG. 13 is a circuit schematic diagram of RA driver according to one embodiment.
Figure 14:
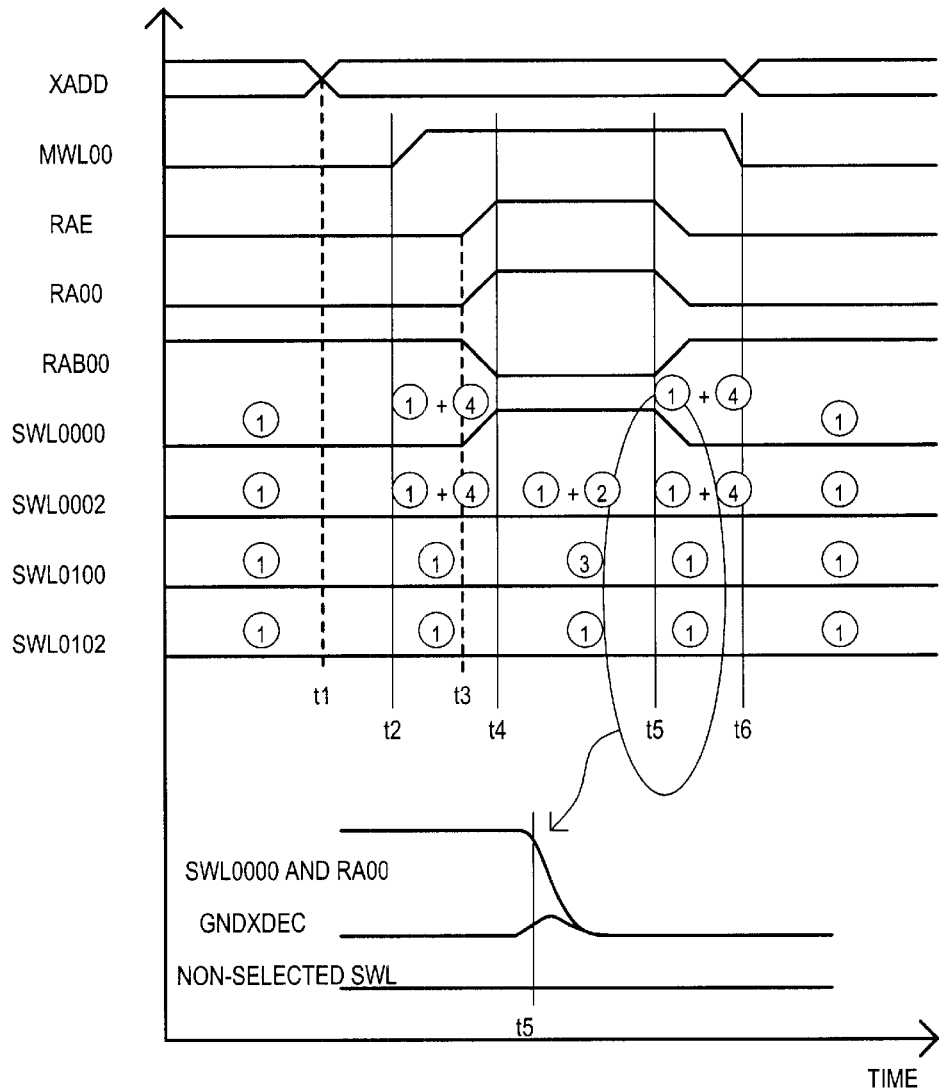
FIG. 14 is a timing diagram illustrating current paths to and from sub-word lines during an access cycle according to an embodiment.

An embodiment of the present invention is illustrated in FIGS. 12, 13, and 14.

Figure 1:
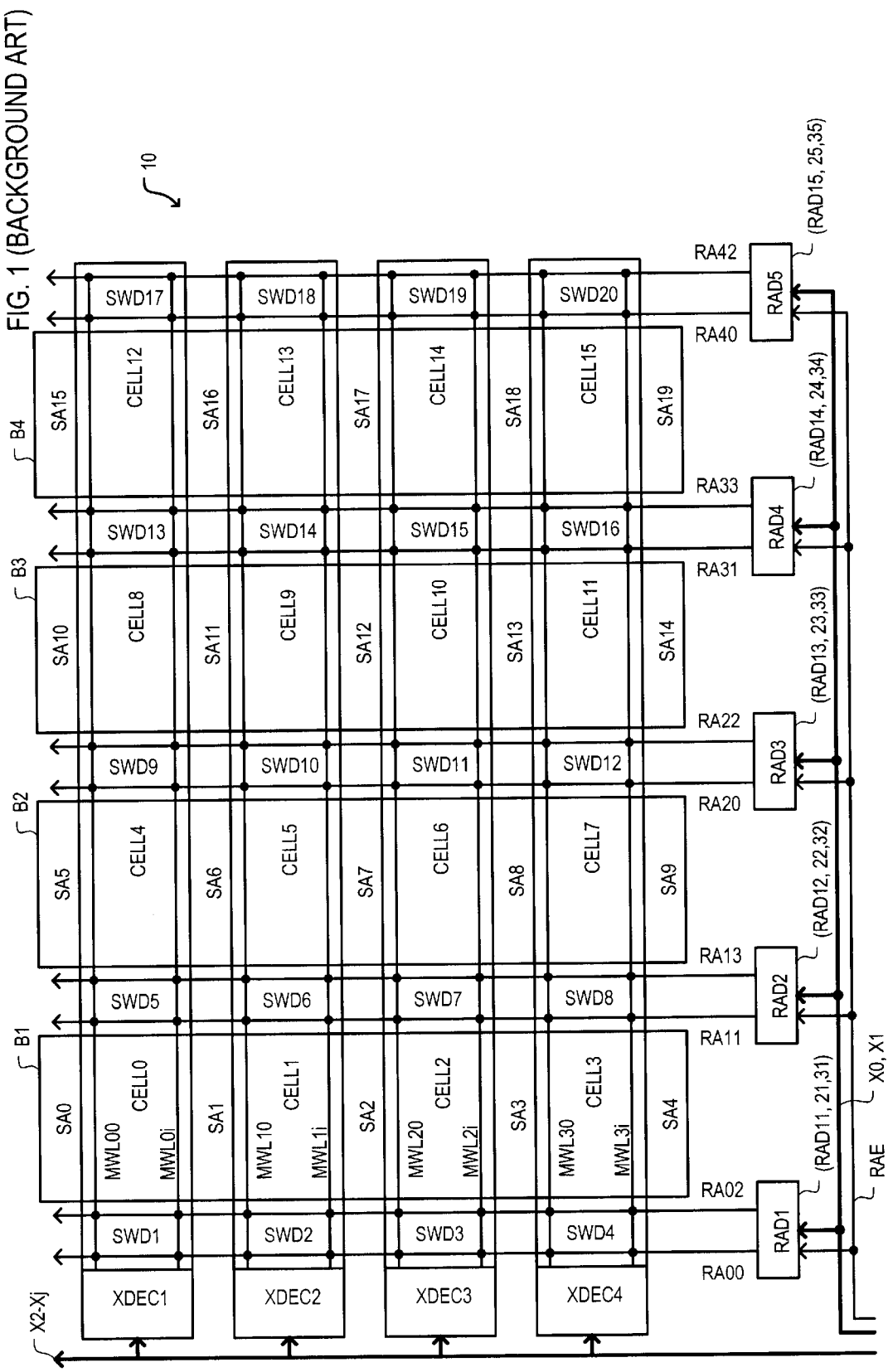
FIG. 1 is a block schematic diagram of a DRAM.
Figure 2:
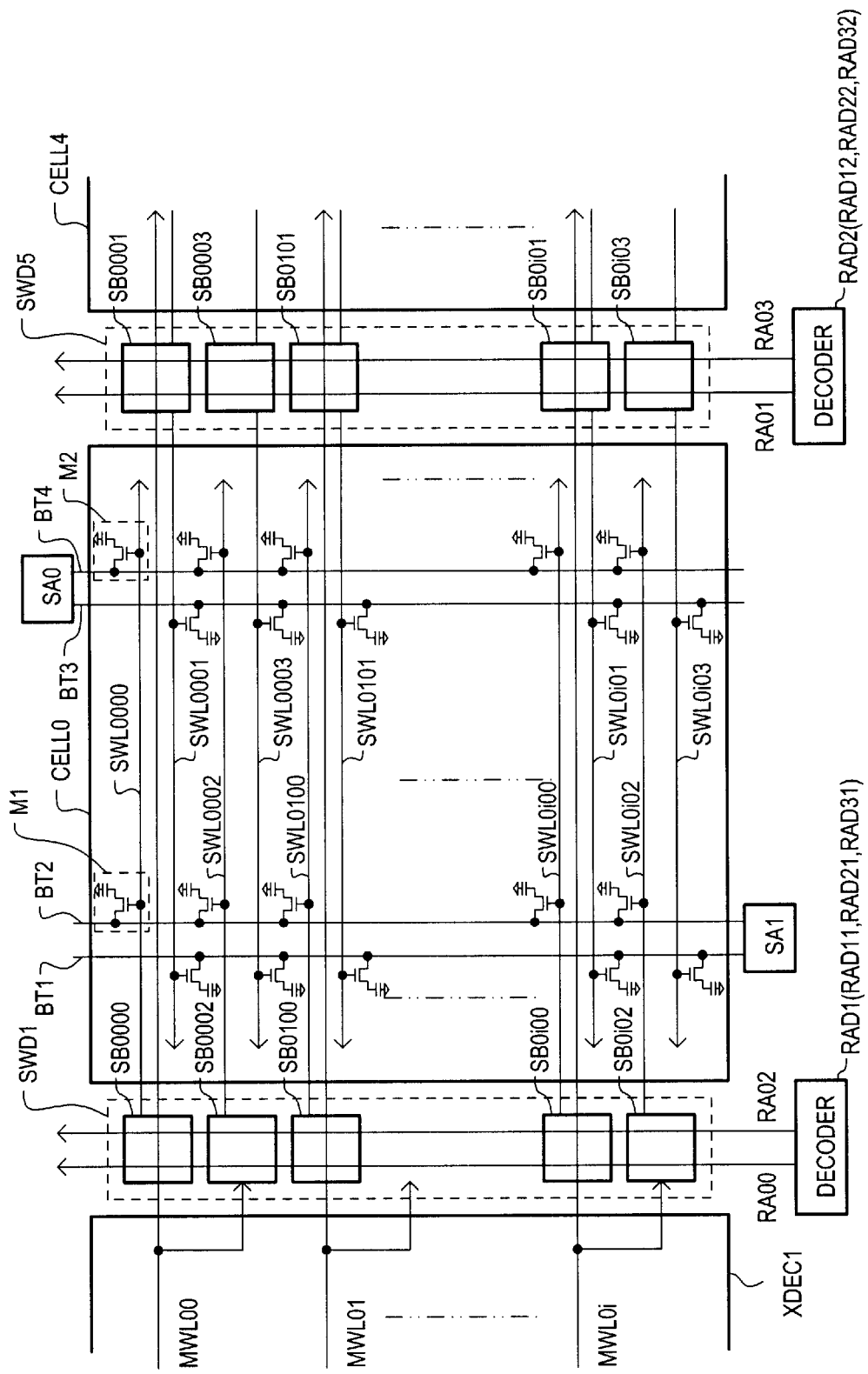
FIG. 2 is a block schematic diagram of a portion of a conventional DRAM.
Figure 3:
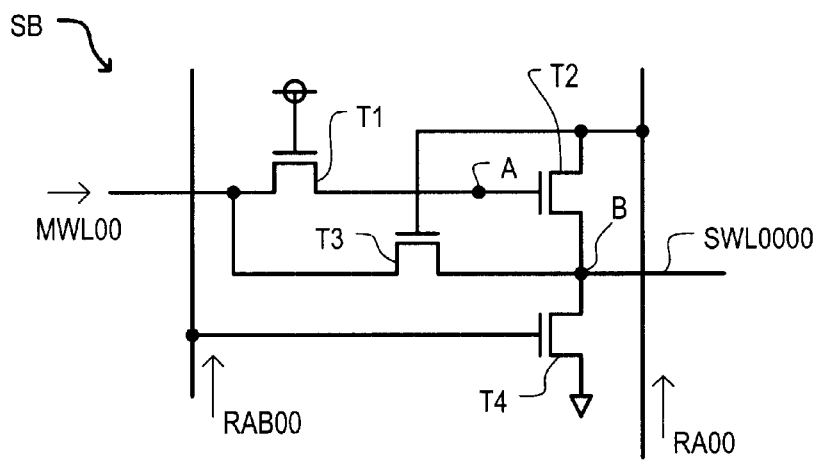
FIG. 3 is a circuit schematic diagram of a conventional sub-decoder block.
Figure 4:
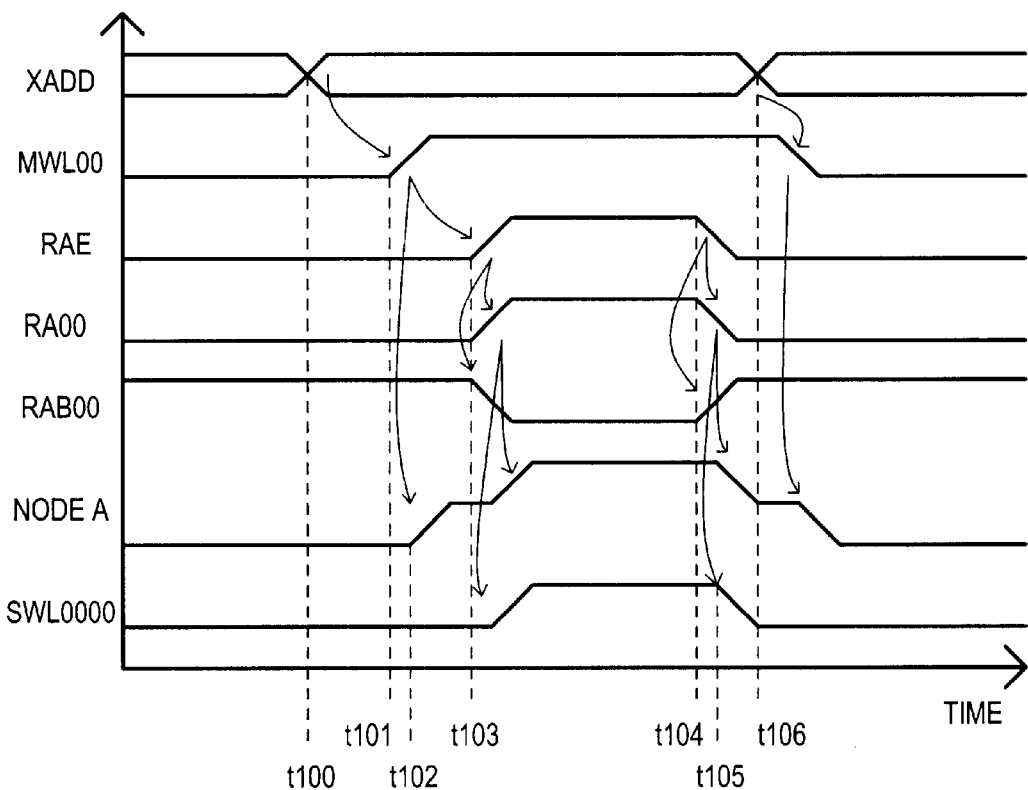
FIG. 4 is a timing diagram illustrating the operation of a conventional sub-decoder block.
Figure 5:
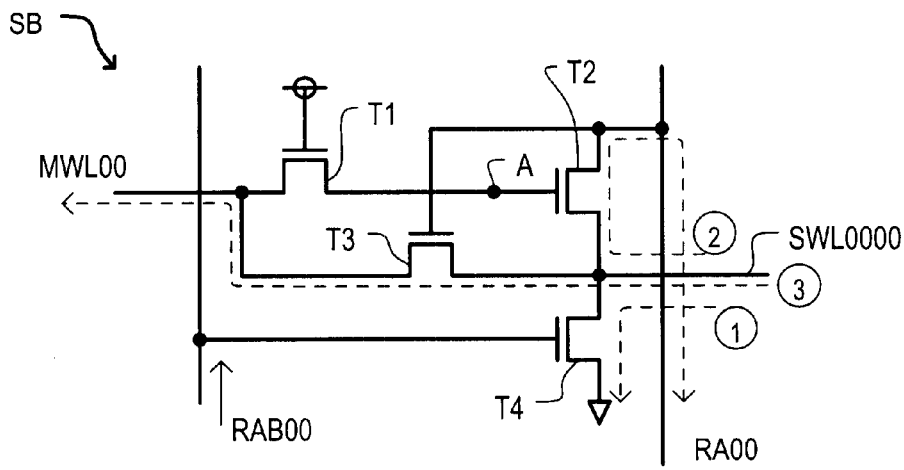
FIG. 5 is a circuit schematic diagram illustrating current paths in a sub-decoder block.
Figure 6:
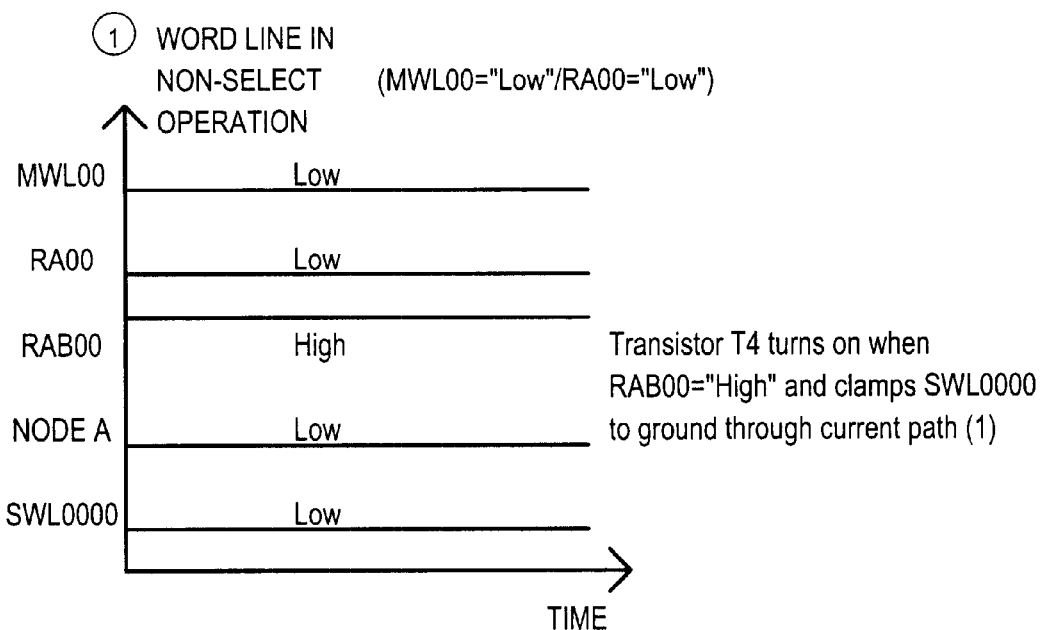
FIG. 6 is a timing diagram of illustrating signals for a sub-decoder block when a sub-word line is in a non-selected state.
Figure 7:
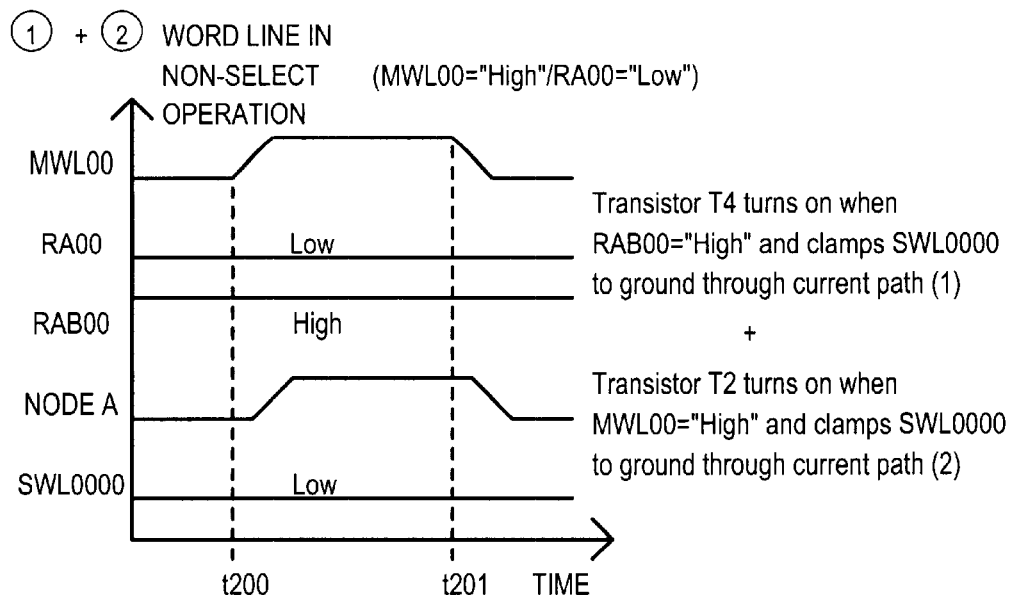
FIG. 7 is a timing diagram of illustrating signals for a sub-decoder block when a sub-word line is in a non-selected state.
Figure 8:
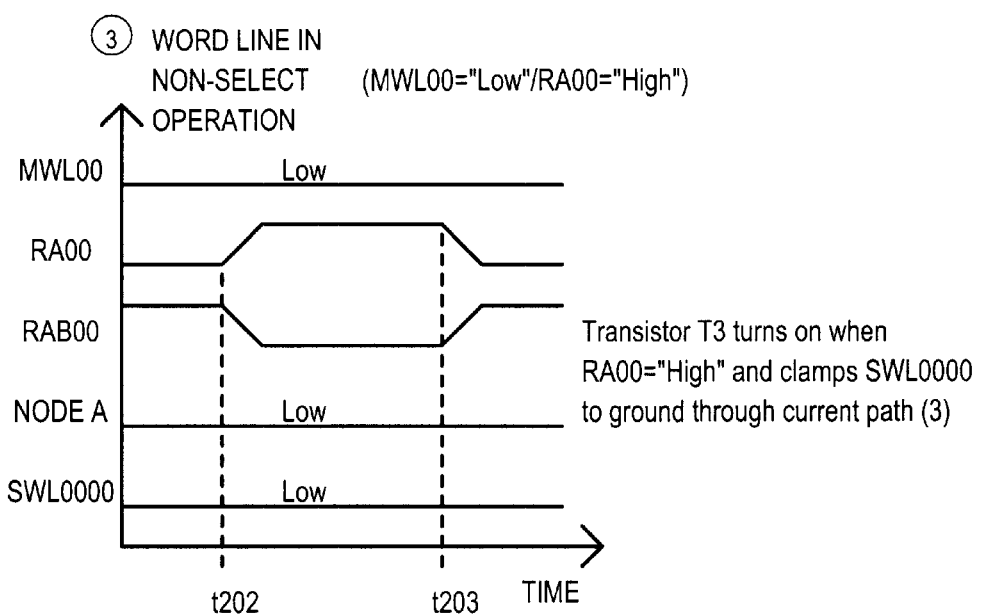
FIG. 8 is a timing diagram of illustrating signals for a sub-decoder block when a sub-word line is in a non-selected state.

The architectural arrangement of the semiconductor memory may be similar to the semiconductor memory illustrated in FIGS. 1, 2, and 3.

Referring now to FIG. 12, a circuit schematic diagram of portions circuits used to activate sub-word lines SWL according to one embodiment is set forth.

Figure 9:
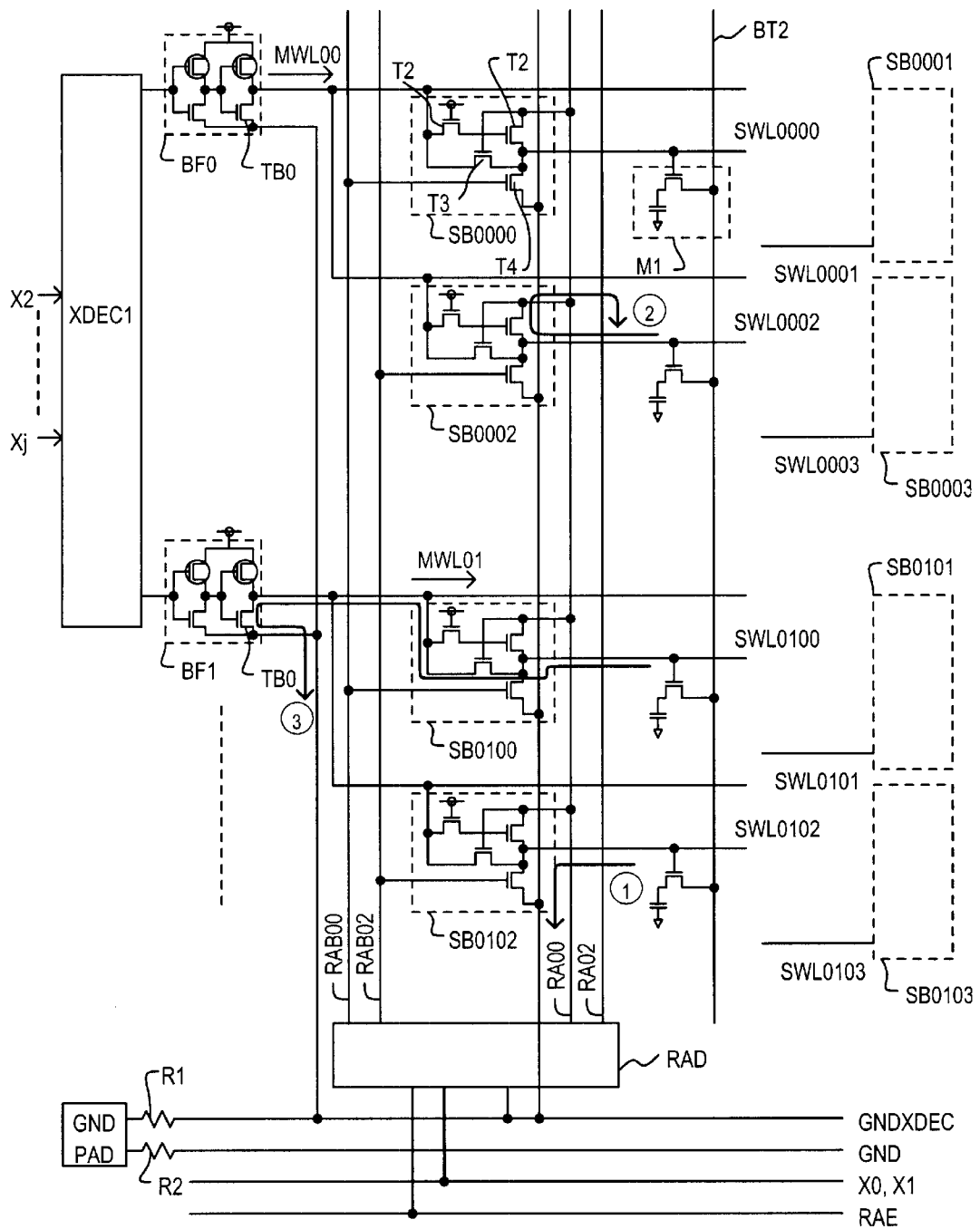
FIG. 9 is a circuit schematic diagram illustrating portions of circuits used to activate sub-word lines.
Figure 10:
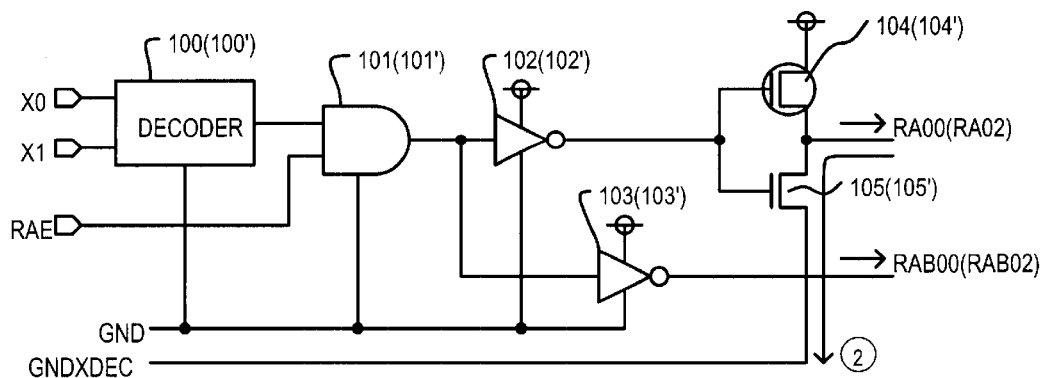
FIG. 10 is a circuit schematic diagram of a conventional RA driver.
Figure 11:
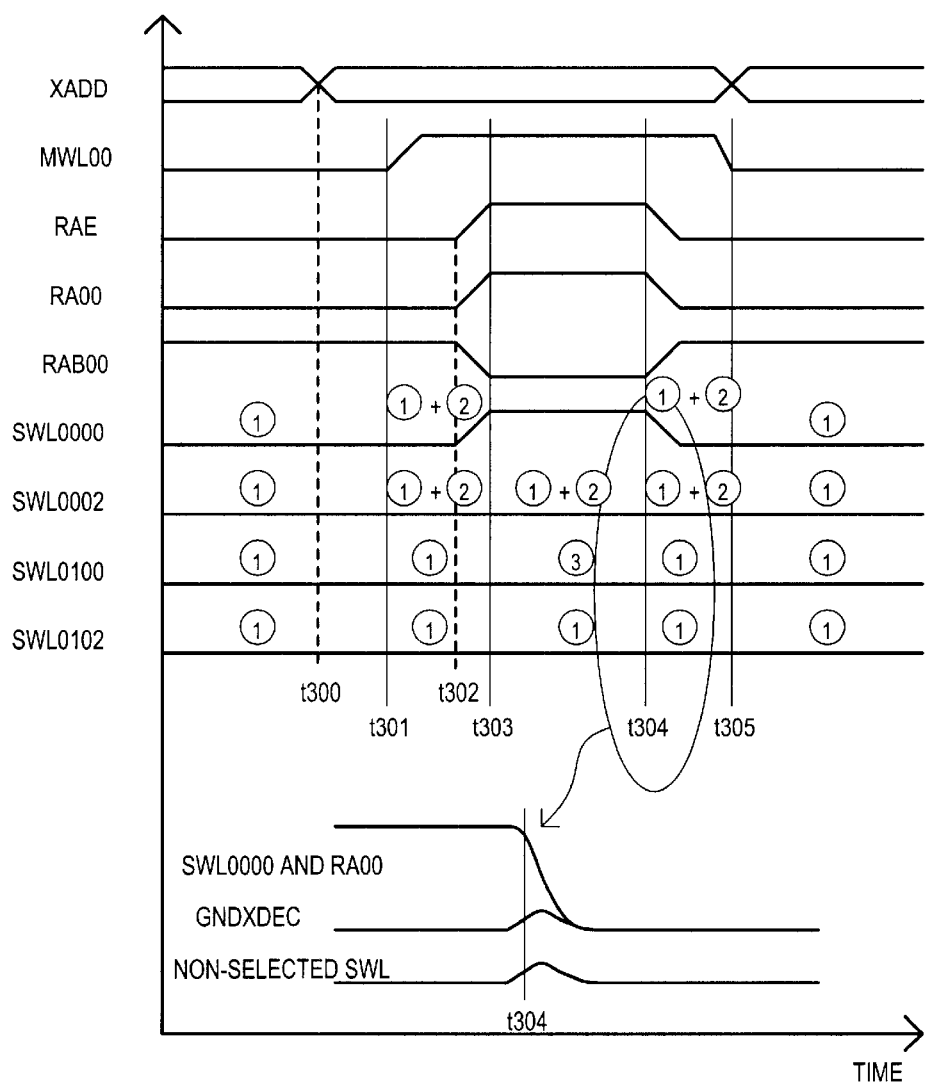
FIG. 11 is a timing diagram illustrating current paths for transferring charge to and from a sub-word line.

FIG. 12 can be similar to FIG. 9, except RA driver RAD11 may replace conventional RA driver RAD.

Referring now to FIG. 13, a circuit schematic diagram of RA driver RAD11 according to one embodiment is set forth.

FIG. 13 illustrates RA driver RAD11A, which may generate RA signal RA00 and complementary RA signal RAB00. Also illustrated is RA driver RAD11B, which may generate RA signal RA02 and complementary RA signal RAB2. Reference characters for RA driver RAD11B are illustrated in parenthesis. Collectively, RA drivers (RAD11A and RAD11B) may make up RA driver RAD11 in FIG. 12.

RA driver RAD11A may include a decoder 100, AND gate 101, inverters (102, 103, and 107) and transistors (104, 105, 106 and 108). Decoder 100 may receive row addresses (X0 and X1) as inputs and generate an output received at an input of AND gate 101. AND gate 101 may receive control signal RAE at another input and provide an output to the inputs of inverters (102 and 103). Inverter 103 may provide complementary RA signal RAB00 as an output. Inverter 102 may provide an output to the gates of transistors (104 and 105). Transistor 104 may have a source connected to a boosted power supply potential and a drain connected to RA signal RA00. Transistor 105 may have a drain connected to RA signal RA00 and a source connected to a drain of transistor 106. Transistor 106 may have a source connected to word line ground potential GNDXDEC and a gate may receive control signal RAE. Inverter 107 may receive control signal RAE as an input and may provide an output to a gate of transistor 108. Transistor 108 may have a source connected to peripheral ground GND and a drain connected to RA signal RA00. Transistor 104 may be a p-type IGFET. Transistors (105, 106 and 108) may be n-type IGFETs.

A peripheral ground potential GND may be connected as a ground for decoder 100, AND gate 101, and inverters (102, 103, and 107).

When control signal RAE is low, the output of AND gate 101 may be low. With the output of AND gate 101 low, inverter 103 may apply a high output to complementary RA signal RAB00. Inverter 102 may apply a high to the gates of transistors (104 and 105), thus transistor 104 may be turned off and transistor 105 may be turned on. With control signal RAE low, transistor 106 may be turned off. Inverter 107 may apply a high output to the gate of transistor 108. Transistor 108 may be turned on, thus, providing a low impedance path from RA signal RA00 to peripheral ground GND. In this way, RA signal RA00 may be low while complementary RA signal may be high.

When control signal RAE is high, and row addresses (X1, X0) are in a select state, which for decoder 100 of RA driver RAD11A may be {low, low}, then the output of decoder 100 may become high. With the output of decoder 100 high and control signal RAE high, the output of AND gate 101 may become high. With the output of AND gate 101 high, inverter 103 may generate a low complementary RA signal RAB00. With RAE signal high, transistor 106 may be turned on. Inverter 107 may apply a low level to the gate of transistor 108, which can turn transistor 108 off. With the output of AND gate 101 high, inverter 102 may apply a low level to the gates of transistors (104 and 105). Thus, transistor 104 may be turned on and transistor 105 may be turned off. With transistor 104 turned on, a boosted potential may be applied to RA signal RA00. Thus, RA signal RA00 may be high and complementary RA signal RAB00 may be low.

The output of decoder 100 may be conceptualized as a decode signal. The decode signal may be high based on a predetermined value of row addresses (X0 and X1). Otherwise, the decode signal may be low.

If control signal RAE is high and RA driver RAD11A receives row addresses (X1, X0) having a value other than {low, low}, then the output of decoder 100 may be low. With the output of decoder 100 low, the output of AND gate 101 may be low. Thus inverter 103 may apply a boosted potential to complementary RA signal RAB00 and complementary RA signal RAB00 may be high. Inverter 102 may apply a boosted potential (high level) to the gates of transistors (104 and 105). Thus, transistor 104 may be turned off and transistor 105 may be turned on. With RAE high, transistor 106 may be turned on and transistor 108 may be turned off. With transistors (105 and 106) turned on, a low impedance path may be provided through transistors (105 and 106) from RA signal RA00 to word line ground potential GNDX-DEC. In this way, RA signal RA00 may be low while complementary RA signal may be high.

In order to sink sufficient current to discharge RA signal RA00, transistor 108 may be relatively large as compared to other transistors, such as transistors (105 and 106). Also transistor 108 may be relatively large compared to transistor T4 illustrated in sub-decoder block SB0000 illustrated in FIG. 12.

Transistor 108 may be conceptualized as a discharge device, in which a discharge current path 4 may be provided. In this way, transistor 108 may sink current that may be used to switch a sub-word line SWL from high to low. In this way transistor 108 may have a gate width that may have sufficient current sinking capabilities to switch a sub-word line SWL from a high to a low in a required minimum time. This may allow a sub-word line to change from a boosted potential level to the low (ground) level at a high speed at the end of a memory cell access cycle.

Transistor 108 may receive a boosted potential at a control gate when enabled, which may provide a lower impedance path and increase current capabilities, as compared to a non-boosted potential being received at a control gate.

Transistors (T4, 105, and 106) may be conceptualized as holding devices, in which a current path 2 is provided that may hold unselected sub-word lines SWL clamped to a ground level. Thus, transistors (T4, 105, and 106) may not need large current sinking capabilities. With smaller device sizes, transistors (T4, 105, and 106) may provide sufficient current capabilities to keep unselected sub-word lines SWL clamped to a ground level while suppressing noise generated within the peripheral ground potential GND. In particular, transistors (T4, 105, and 106) may suppress noise created by current spikes. In this case, the ground level may be the word line ground potential GNDXDEC.

Referring once again to FIG. 12 in conjunction with FIG. 13, when transistor T2 within sub-decoder block SB0000 is turned on (main word line MWL00 is high) and control signal RAE is low, transistor 108 may be turned on and RA signal RA00 may be electrically connected with peripheral ground GND. In this case, current path 4 may be used to remove charge from sub-word line SWL0000.

When control signal RAE is high and row addresses (X1, X0) have a value {low, low}, then RA driver RAD11A may output a RA signal RA00 having a high level and complementary RA signal RAB00 having a low level.

When control signal RAE is high and row addresses (X1, X0) do not have a value {low, low}, then RA driver RAD11A may output a RA signal RA00 having a low level and complementary RA signal RAB00 having a high level.

FIG. 13 also illustrates a circuit schematic diagram of RA driver RAD11B. The general reference characters for RA driver RAD11B are illustrated in parenthesis. RA driver RAD11B may be constructed in the same general manner as RA driver RAD11A. RA driver RAD11B may operate in the same general manner as RA driver RAD11A except decoder 100' may be enabled to output a logic high when row addresses (X1, X0) have the value of {low, high}, respectively.

As previously mentioned, RA drivers (RAD11A and RAD11B) may collectively make up RA driver RAD11 in FIG. 12.

Referring now to FIG. 1, illustrated in parenthesis, RA drivers (RAD11, RAD12, RAD13, RAD14, and RAD15) according to the embodiment of FIG. 13 are illustrated in a semiconductor memory device such as DRAM 10.

RA drivers (RAD12, RAD13, RAD14, and RAD15) may have similar circuit construction to RA driver RAD11.

Referring once again to FIG. 12, it can be noted that wiring providing peripheral ground potential GND and wiring providing word line ground potential GNCXDEC may be electrically connected through separate wirings to the same ground pad GND PAD. Wiring providing word line ground potential GNCXDEC may have a wiring resistance R1. Wiring providing peripheral ground GND may have a wiring resistance R2. Potential variations within the respective wirings may be separated due to wiring resistance R1 and wiring resistance R2.

Discharge current may primarily flow through peripheral ground GND through current path 4. Such discharge current may include, discharging sub-word line SWL0000 capacitance, diffusion capacitance of transistors (T2 and T4), gate capacitance of transistor T3, capacitance of RA signal RA00, etc. By providing the separate wirings, noise caused by discharging a sub-word line SWL0000 on peripheral ground GND may be isolated from word line ground GNDXDEC. This may reduce noise on unselected sub-word lines SWL. Although the illustration discusses discharging sub-word line SWL0000, the same may apply to discharging any sub-word line SWL.

In this way, the potential of word line ground GNDXDEC may be prevented from rising when sub-word line SWL0000 is discharged, and the potential of non-selected sub-word lines electrically connected to word line ground GNDXDEC may remain low. Thus, the data in memory cells connected to the non-selected sub-word lines may not be disturbed by leakage induced by an increase in potential of the non-selected sub-word lines.

The operation of the embodiment illustrated in FIGS. 12 and 13 will be described.

Referring now to FIG. 14, a timing diagram illustrating current paths to and from sub-word lines during an access cycle according to an embodiment is set forth.

The timing diagram of FIG. 14, includes row address XADD, main word line MWL00, control signal RAE, RA signal RA00, complementary RA signal RAB00, sub-word line SWL0000, sub-word line SWL0002, sub-word line SWL0100, and sub-word line SWL0102. Also illustrated is a blown up portion around time t5, illustrating sub-word line SWL0000, RA signal RA00, peripheral ground GND, and word line ground XDECGND. Row address XADD may correspond to a plurality of row addresses {Xj, . . . , X2, X1, X0} that may be used to select a sub-word line SWL.

Before time t1, row address XADD may have a value that does not select sub-word line SWL0000. Main word line MWL00 may be low. Control signal RAE may be low. RA signal RA00 may be low. Complementary RA signal RAB00 may be high. Sub-word lines (SWL0000, SWL0002, SWL0100, and SWL0102) may all be in the non-selected state (low) and may be at the ground potential.

At this time, because complementary RA signals (RAB00 and RAB02) are high, transistor T4 (FIG. 12) within sub-decoder blocks SB may be turned on and sub-word lines (SWL0000, SWL0002, SWL0100, and SWL0102) may be clamped low by current path 1.

At time t1, row address XADD may change to a value that corresponds to the selection of sub-word line SWL0000. After a propagation delay, at time t2, row decoder XDEC1 may activate main word line MWL00. Thus, at time t2, main word line MWL00 may transition to a high potential. The high potential may be a boosted high potential.

At this time, because complementary RA signals (RAB00 and RAB02) are high, transistor T4 (FIG. 12) within sub-decoder blocks SB may be turned on and sub-word lines (SWL0000, SWL0002, SWL0100, and SWL0102) may be clamped low by current path 1. However, because main word line MWL00 is high and RA signals (RA00 and RA02) are low, transistor T2 within sub-decoder blocks (SB0000 and SB0002) may be turned on and sub-word lines SWL0000 and SWL00002) may also be clamped low by current path 4.

After a predetermined delay time from the change of row address signal XADD, a control circuit (not shown) may bring control signal RAE from a low level to a high level. This is illustrated at time t3.

When control signal RAE becomes high, RA driver RAD11 may provide a high RA signal RA00 and a low complementary RA signal RAB00. RA signal RA00 may be at a boosted potential. With RA signal RA00 high, sub-word line SWL0000 may be driven high (to a boosted potential) through transistor T2 within sub-decoder block SB0000. This is illustrated at time t4.

With sub-word line SWL0000 at a high level, memory cell M1 may be accessed and data stored may be output to bit line BT2.

When control signal RAE transitions to a high level, transistor 108' within RA driver RAD11B (FIG. 13) may turn off and transistor 106' may turn on. Thus, current path 4 may be disabled and current path 2 may be enabled. In this way, current path 2 within RA driver RAD11B may be used to clamp sub-word line SWL0002 at a low level. Because complementary RA signal RAB02 may remain high, transistor T4 within sub-decoder block SB0002 may remain on and current path 1 may also still be used to clamp sub-word line SWL002 at a low level.

Because main word line MWL01 is low, RA signal RA00 is high, and complementary RA signal RAB00 is low, transistors (T2 and T4) may be turned off within sub-word block SB0100 and transistor T3 may be turned on. In this way, current path 3 may be enabled to clamp sub-word line SWL0100 at a low level.

After a predetermined time (time t5), based on the maximum time required to access a memory cell, the control circuit (not shown) may drive control signal RAE low.

Also, at time t5, within RA driver RAD11A, transistor 106 may be turned off and transistor 108 may be turned on. Within RA driver RAD11A current path 2 may be turned off and current path 4 may be turned on. RA driver RAD11A may drive RA signal RA00 to the low level and complementary RA signal RAB00 to the high level. RA signal RA00 going low discharges sub-word line SWL0000. Because complementary RA signal RAB00 is high, current path 1 within sub-word block SB0000 may also be on. However, current path 1 within sub-block SB0000 may go through transistor T4. Transistor T4 may have significantly smaller current sinking capacity than transistor 108 within RA driver RAD11A. Thus, a larger amount of discharge current may flow through current path 4 instead of current path 1. In this way, switching noise may occur on peripheral ground GND while being minimized on word line ground GNDXDEC.

Within RA driver RAD11B, transistor 106' may be turned off and transistor 108' may be turned on. Thus, current path 2 may be turned off and current path 4 may be turned on. Sub-word line SWL0002 may be clamped to the low level by current paths (1 and 4).

Because RA signal RA00 is low, transistor T3 within sub-block decoder SB0100 may turn off and current path 3 may be disabled. However, because complementary RA signal RAB00 is high, transistor T4 within sub-block decoder SB0100 may turn on and current path 1 may be enabled. In this way, at time t5, sub-word line SWL0100 may be maintained at a low potential through current path 1.

Sub-word line SWL0102 may still be maintained at a low potential through current path 1 through sub-block decoder SB0102.

At time t6, row address may change to a status corresponding to an address where neither main word line MWL00 or main word line MWL01 is active. Thus, main word line MWL00 may transition to a low level.

With main word line MWL00 at a low level, transistor T2 within sub-decoder blocks (SB0000 and SB0002) may be turned off. This can disable current paths 4 and sub-word lines (SWL0000 and SWL0002) may be maintained at a low level through current paths 1 of sub-decoder blocks (SB0000 and SB0002), respectively.

Within each sub-decoder block SB, transistor T2 may have a large current capacity (as compared to, for example, transistor T4) in order to allow the respective sub-word line SWL to rapidly rise. Transistor T2 may also be used in the discharge current path to allow SWL to rapidly fall. In this way access time may be achieved at a high speed.

Also illustrated in FIG. 14, is a blown up portion of sub-word line SWL0000, RA signal RA00, peripheral ground GND, and word line ground GNDXDEC. The blown up portion is illustrative of the time when sub-word line SWL0000 is being discharged at time t5. By providing transistor T108 within RA driver RAD11A with a significantly higher current sinking capability than transistor T4 within sub-word block SB0000, a larger portion of the discharge current when switching sub-word line SWL0000 from the boosted high potential to a low potential may flow to peripheral ground GND through current path 4. A smaller portion of the discharge current may flow to word line ground GNDXDEC through current path 1. In this way, peripheral ground GND may have a noise bump as illustrated, but the noise bump may not be imposed upon word line ground GNDXDEC. Thus, non-selected sub-word lines (SWL0002, SWL0100, and SWL0102) may not be adversely affected.

By using the embodiment illustrated in FIGS. 12, 13, and 14, noise spikes on ground lines caused by discharging selected word lines may be reduced so that non-selected word lines may not be affected. This may reduce adverse affects to data integrity.

Figure 15:
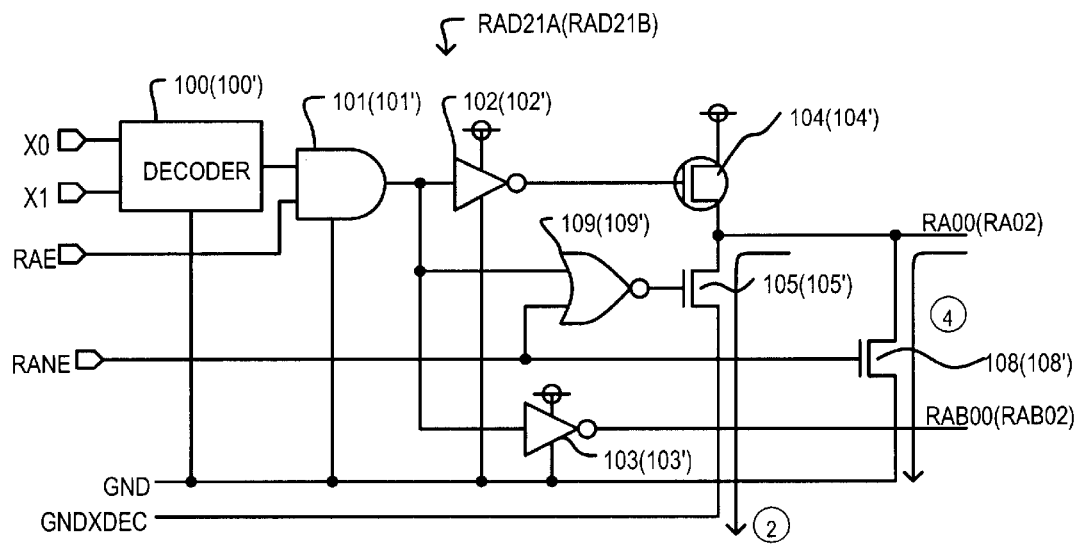
FIG. 15 is a circuit schematic diagram of a RA driver according to an embodiment.
Figure 16:
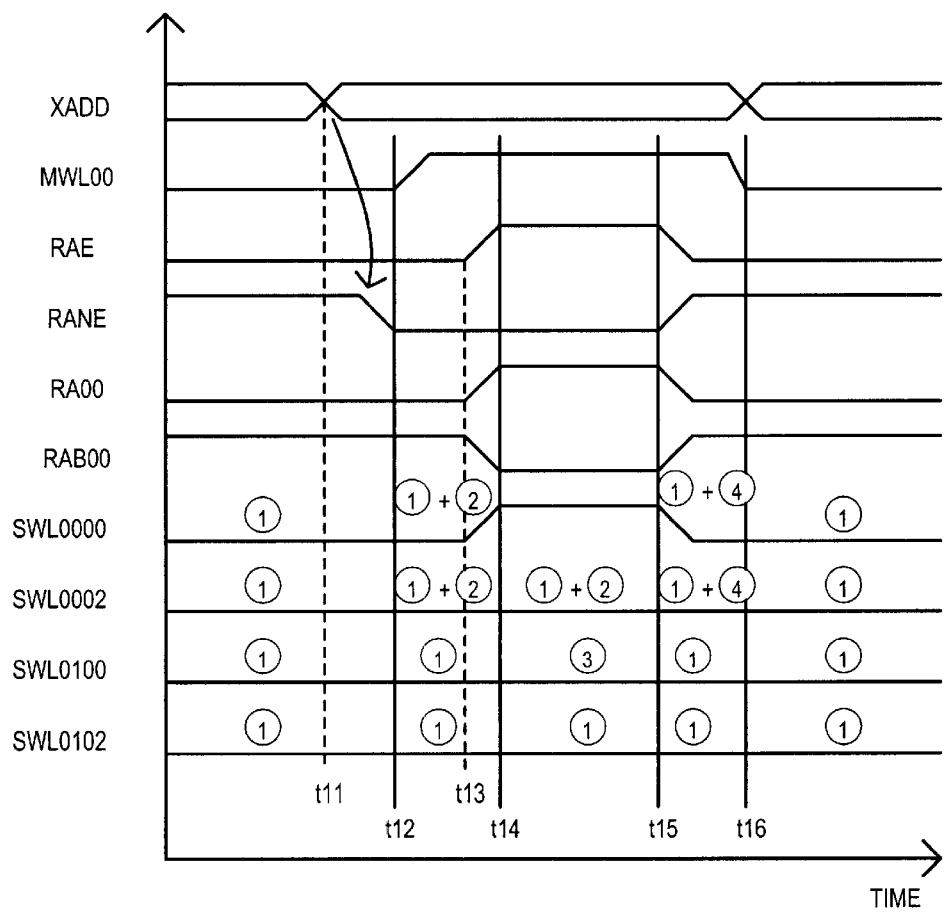
FIG. 16 is a timing diagram illustrating current paths to and from sub-word lines during an access cycle according to an embodiment.

Another embodiment of the present invention is illustrated in FIGS. 12, 15, and 16.

The architectural arrangement of the semiconductor memory may be similar to the semiconductor memory illustrated in FIG. 1, except RA drivers (RAD21, RAD22, RAD23, RAD24, and RAD25) may be used.

Referring now to FIG. 12, in the embodiment of FIGS. 15 and 16, RA driver RAD21 may be used.

Referring now to FIG. 15, a circuit schematic diagram of RA driver RAD21 according to one embodiment is set forth.

FIG. 15 illustrates RA driver RAD21A, which may generate RA signal RA00 and complementary RA signal RAB00. Also illustrated is RA driver RAD21B, which may generate RA signal RA02 and complementary RA signal RAB02. Reference characters for RA driver RAD21B are illustrated in parenthesis. Collectively, RA drivers (RAD21A and RAD21B) may make up RA driver RAD21 in FIGS. 1 and 12.

RA driver RAD21 may have similar constituents to RA driver RAD11, such constituents may be referred to by the same reference character.

RA driver RAD21A may include a decoder 100, AND gate 101, inverters (102 and 103), NOR gate 109, and transistors (104, 105, and 108). Decoder 100 may receive row addresses (X0 and X1) as inputs and generate an output received at an input of AND gate 101. AND gate 101 may receive control signal RAE at another input and provide an output to the inputs of inverters (102 and 103) and NOR gate 109. Inverter 103 may provide complementary RA signal RAB00 as an output. Inverter 102 may provide an output to the gate of transistor 104. Transistor 104 may have a source connected to a boosted power supply potential and a drain connected to RA signal RA00. Control signal RANE may be connected to an input of NOR gate 109 and a gate of transistor 108. NOR gate 109 may have an output connected to a gate of transistor 105. Transistor 105 may have a drain connected to RA signal RA00 and a source connected word line ground potential GNDXDEC. Transistor 108 may have a source connected to peripheral ground GND and a drain connected to RA signal RA00. Transistor 104 may be a p-type IGFET. Transistors (105 and 108) may be n-type IGFETs.

A peripheral ground potential GND may be connected as a ground for decoder 100, AND gate 101, NOR gate 109, and inverters (102 and 103).

The functionality of RA driver RAD21A will now be described.

When control signal RAE is low, the output of AND gate 101 may be low. With the output of AND gate 101 low, inverter 103 may apply a high output to complementary RA signal RAB00. Inverter 102 may apply a high to the gate of transistor 104, thus transistor 104 may be turned off. If control signal RANE is high, transistor 108 may be turned on and may pull RA signal RA00 low through current path 4. Also, NOR gate 109 may apply a low to the gate of transistor 105 and transistor 105 may be turned off. If control signal RANE is low, transistor 108 may be turned off. Also, NOR gate 109 may apply a high to the gate of transistor 105 and transistor 105 will turn on. RA signal RA00 may be pulled low through current path 2.

When control signal RAE is high, and row addresses (X1, X0) are in a select state, which for decoder 100 of RA driver RAD21A may be {low, low}, then the output of decoder 100 may become high. With the output of decoder 100 high and control signal RAE high, the output of AND gate 101 may become high. With the output of AND gate 101 high, inverter 103 may generate a low complementary RA signal RAB00. When control signal RAE is high, control signal RANE may be low. In this way, NOR gate 109 may operate as an inverter with respect to the output of AND gate 101. With control signal RANE low, transistor 108 may be turned off. With the output of AND gate 101 high, inverter 102 may apply a low signal to the gate of transistor 104, thus transistor 104 may be turned on. NOR gate 109 may apply a low signal to the gate of transistor 105, thus transistor 105 may be turned off. With transistor 104 turned on and transistors (105 and 108) turned off, RA signal RA00 may be pulled to a boosted high potential. Thus, RA signal RA00 may be high and complementary RA signal may be low.

If control signal RAE is high and RA driver RAD11A receives row addresses (X1, X0) having a value other than {low, low}, then the output of decoder 100 may be low. With the output of decoder 100 low, the output of AND gate 101 may be low. Thus inverter 103 may apply a boosted potential to complementary RA signal RAB00 and complementary RA signal RAB00 may be high. Inverter 102 may apply a boosted potential (high level) to the gate of transistor 104. Thus, transistor 104 may be turned off. . If control signal RANE is high, transistor 108 may be turned on and may pull RA signal RA00 low through current path 4. Also, NOR gate may apply a low to the gate of transistor 105 and transistor 105 may be turned off. If control signal RANE is low, transistor 108 may be turned off. Also, NOR gate 109 may apply a high to the gate of transistor 105 and transistor 105 will turn on. RA signal RA00 may be pulled low through current path 2.

In order to sink sufficient current to discharge RA signal RA00, transistor 108 may be relatively large as compared to other transistors, such as transistor 105. Also, transistor 108 may be relatively large compared to transistor T4 illustrated in sub-decoder block SB0000 illustrated in FIG. 12.

Transistor 108 may be conceptualized as a discharge device, in which a discharge current path 4 may be provided. In this way, transistor 108 may sink current that may be used to switch a sub-word line SWL from high to low. Transistor 108 may have a gate width that may provide sufficient current sinking capabilities to switch a sub-word line SWL from a high to a low in a required minimum time. This may allow a sub-word line to change from a boosted potential level to the low (ground) level at a high speed at the end of a memory cell access cycle.

A control circuit (not shown) may generate control signals (RAE and RANE). Control signal RANE may transition from a high to a low a predetermined time period after a row address XADD is received. Control signal RAE may transition from a low to high a predetermined time period after control signal RANE transitions to low. Control signal RAE may transition back low and control signal RANE may transition back high at the end of an access cycle.

Control signal RANE may have a boosted potential when high. In this way, transistor 108 may receive a boosted potential at a control gate when enabled, which may provide a lower impedance path and increase current capabilities, as compared to a non-boosted potential being received at a control gate.

Transistors (T4 and 105) may be conceptualized as holding devices, in which a current path 2 is provided that may hold unselected sub-word lines SWL clamped to a ground level. Thus, transistors (T4 and 105) may not need large current sinking capabilities. With smaller device sizes, transistors (T4 and 105) may provide sufficient current capabilities to keep unselected sub-word lines SWL clamped to a ground level while suppressing noise generated within the peripheral ground potential GND. In particular, transistors (T4 and 105) may suppress noise created by current spikes. In this case, the ground level may be the word line ground potential GNDXDEC.

Referring once again to FIG. 12 in conjunction with FIG. 15, when transistor T2 within sub-decoder block SB0000 is turned on (main word line MWL00 is high) and control signal RANE is high, transistor 108 may be turned on and RA signal RA00 may be electrically connected with peripheral ground GND. In this case, current path 4 may be used to remove charge from sub-word line SWL0000.

When control signal RAE is high, control signal RANE is low, and row addresses (X1, X0) have a value {low, low}, then RA driver RAD21A may output a RA signal RA00 having a high level and complementary RA signal RAB00 having a low level.

When control signal RAE is high, control signal RANE is low, and row addresses (X1, X0) do not have a value {low, low}, then RA driver RAD21A may output a RA signal RA00 having a low level and complementary RA signal RAB00 having a high level.

FIG. 15 also illustrates a circuit schematic diagram of RA driver RAD21B. The general reference characters for RA driver RAD21B are illustrated in parenthesis. RA driver RAD21B may be constructed in the same general manner as RA driver RAD21A. RA driver RAD21B may operate in the same general manner as RA driver RAD21A except decoder 100' may be enabled to output a logic high when row addresses (X1, X0) have the value of {low, high}, respectively.

As previously mentioned, RA drivers (RAD21A and RAD21B) may collectively make up RA driver RAD21 in FIG. 12.

Referring now to FIG. 1, illustrated in parenthesis, RA drivers (RAD21, RAD22, RAD23, RAD24, and RAD25) according to the embodiment of FIG. 15 are illustrated in a semiconductor memory device such as DRAM 10.

RA drivers (RAD22, RAD23, RAD24, and RAD25) may have similar circuit construction to RA driver RAD21.

Referring once again to FIG. 12, it can be noted that wiring providing peripheral ground potential GND and wiring providing word line ground potential GNCXDEC may be electrically connected through separate wirings to the same ground pad GND PAD. Wiring providing word line ground potential GNCXDEC may have a wiring resistance R1. Wiring providing peripheral ground GND may have a wiring resistance R2. Potential variations within the respective wirings may be separated due to wiring resistance R1 and wiring resistance R2.

Discharge current may primarily flow through peripheral ground GND through current path 4. Such discharge current may include, discharging sub-word line SWL0000 capacitance, diffusion capacitance of transistors (T2 and T4), gate capacitance of transistor T3, capacitance of RA signal RA00, etc. By providing the separate wirings, noise caused by discharging a sub-word line SWL0000 on peripheral ground GND may be isolated from word line ground GNDXDEC. This may reduce noise on unselected sub-word lines SWL. Although the illustration discusses discharging sub-word line SWL0000, the same may apply to discharging any sub-word line SWL.

In this way, the potential of word line ground GNDXDEC may be prevented from rising when sub-word line SWL0000 is discharged. Thus, the potential of non-selected sub-word lines electrically connected to word line ground GNDXDEC may remain low. Thus, the data in memory cells connected to the non-selected sub-word lines may not be disturbed by leakage induced by an increase in potential of the non-selected sub-word lines.

The operation of the embodiment illustrated in FIGS. 12 and 15 will now be described.

Referring now to FIG. 16, a timing diagram illustrating current paths to and from sub-word lines during an access cycle according to an embodiment is set forth.

The timing diagram of FIG. 16, includes row address XADD, main word line MWL00, control signals (RAE and RANE), RA signal RA00, complementary RA signal RAB00, sub-word line SWL0000, sub-word line SWL0002, sub-word line SWL0100, and sub-word line SWL0102. Row address XADD may correspond to a plurality of row addresses {Xj, . . . , X2, X1, X0} that may be used to select a sub-word line SWL.

Before time t11, row address XADD may have a value that does not select sub-word line SWL0000. Main word line MWL00 may be low. Control signal RAE may be low. Control signal RANE may be high. RA signal RA00 may be low. Complementary RA signal RAB00 may be high. Sub-word lines (SWL0000, SWL0002, SWL0100, and SWL0102) may all be in the non-selected state (low) and may be at the ground potential.

At this time, because complementary RA signals (RAB00 and RAB02) are high, transistor T4 (FIG. 12) within sub-decoder blocks SB may be turned on and sub-word lines (SWL0000, SWL0002, SWL0100, and SWL0102) may be clamped low by current path 1.

At time t11, row address XADD may change to a value that corresponds to the selection of sub-word line SWL0000. After a propagation delay, at time t12, row decoder XDEC1 may activate main word line MWL00. Thus, at time t12, main word line MWL00 may transition to a high potential. The high potential may be a boosted high potential. Also, around time t12 (a predetermined delay time from the change of row address signal XADD), a control circuit (not shown) may bring control signal RANE from a high level to a low level.

At this time, because complementary RA signals (RAB00 and RAB02) are high, transistor T4 (FIG. 12) within sub-decoder blocks SB may be turned on and sub-word lines (SWL0000, SWL0002, SWL0100, and SWL0102) may be clamped low by current path 1. However, because main word line MWL00 is high and RA signals (RA00 and RA02) are low, transistor T2 within sub-decoder blocks (SB0000 and SB0002) may be turned on. Also, because control signals (RANE and RAE) are low, current paths 2 within RA drivers (RAD21A and RAD21B) are turned on. Thus, sub-word lines (SWL0000 and SWL00002) may also be clamped low by current path 2.

After a predetermined delay time from the low transition of control signal RANE, a control circuit (not shown) may bring control signal RAE from a low level to a high level. This is illustrated at time t13.

When control signal RAE becomes high, RA driver RAD21 may provide a high RA signal RA00 and a low complementary RA signal RAB00. RA signal RA00 may be at a boosted potential. With RA signal RA00 high, sub-word line SWL0000 may be driven high (to a boosted potential) through transistor T2 within sub-decoder block SB0000. This is illustrated at time t14.

With sub-word line SWL0000 at a high level, memory cell M1 may be accessed and data stored may be output to bit line BT2.

Because main word line MWL01 is low, RA signal RA00 is high, and complementary RA signal RAB00 is low, transistors (T2 and T4) may be turned off within sub-word block SB0100 and transistor T3 may be turned on. In this way, current path 3 may be enabled to clamp sub-word line SWL0100 at a low level.

After a predetermined time (time t15), based on the maximum time required to access a memory cell, the control circuit (not shown) may drive control signal RAE low and control signal RANE high.

Also, at time t15, within RA driver RAD21A, transistor 105 may be turned off and transistor 108 may be turned on. Within RA driver RAD21A current path 2 may be turned off and current path 4 may be turned on. RA driver RAD21A may drive RA signal RA00 to the low level and complementary RA signal RAB00 to the high level. RA signal RA00 going low discharges sub-word line SWL0000. Because complementary RA signal RAB00 is high, current path 1 within sub-word block SB0000 may also be on. However, current path 1 within sub-block SB0000 may go through transistor T4. Transistor T4 may have significantly smaller current sinking capacity than transistor 108 within RA driver RAD21A. Thus, a larger amount of discharge current may flow through current path 4 instead of current path 1. In this way, switching noise may occur on peripheral ground GND while being minimized on word line ground GNDXDEC.

Within RA driver RAD21B, transistor 105' may be turned off and transistor 108' may be turned on. Thus, current path 2 may be turned off and current path 4 may be turned on. Sub-word line SWL0002 may be clamped to the low level by current paths (1 and 4).

Because RA signal RA00 is low, transistor T3 within sub-block decoder SB0100 may turn off and current path 3 may be disabled. However, because complementary RA signal RAB00 is high, transistor T4 within sub-block decoder SB0100 may turn on and current path 1 may be enabled. In this way, at time t15, sub-word line SWL0100 may be maintained at a low potential through current path 1.

Sub-word line SWL0102 may still be maintained at a low potential through current path 1 through sub-block decoder SB0102.

At time t16, row address may change to a status corresponding to an address where neither main word line MWL00 or main word line MWL01 is active. Thus, main word line MWL00 may transition to a low level.

With main word line MWL00 at a low level, transistor T2 within sub-decoder blocks (SB0000 and SB0002) may be turned off. This can disable current paths 4 (within RA drivers RAD21A and RAD21B) and sub-word lines (SWL0000 and SWL0002) may be maintained at a low level through current paths 1 of sub-decoder blocks (SB0000 and SB0002), respectively.

Within each sub-decoder block SB, transistor T2 may have a large current capacity (as compared to, for example, transistor T4) in order to allow the respective sub-word line SWL to rapidly rise. Transistor T2 may also be used in the discharge current path to allow SWL to rapidly fall. In this way access time may be achieved at a high speed.

By providing transistor 108 within RA driver RAD21A with a significantly higher current sinking capability than transistor T4 within sub-word block SB0000, a larger portion of the discharge current when switching sub-word line SWL0000 from the boosted high potential to a low potential may flow to peripheral ground GND through current path 4. A smaller portion of the discharge current may flow to word line ground GNDXDEC through current path 1. In this way, peripheral ground GND may receive current while word line ground GNDXDEC may remain "quiet". Thus, non-selected sub-word lines (SWL0002, SWL0100, and SWL0102) may not be adversely affected.

By using the embodiment illustrated in FIGS. 12, 15, and 16, noise spikes on ground lines caused by discharging selected word lines may be reduced so that non-selected word lines may not be affected. This may reduce adverse affects to data integrity.

Figure 17:
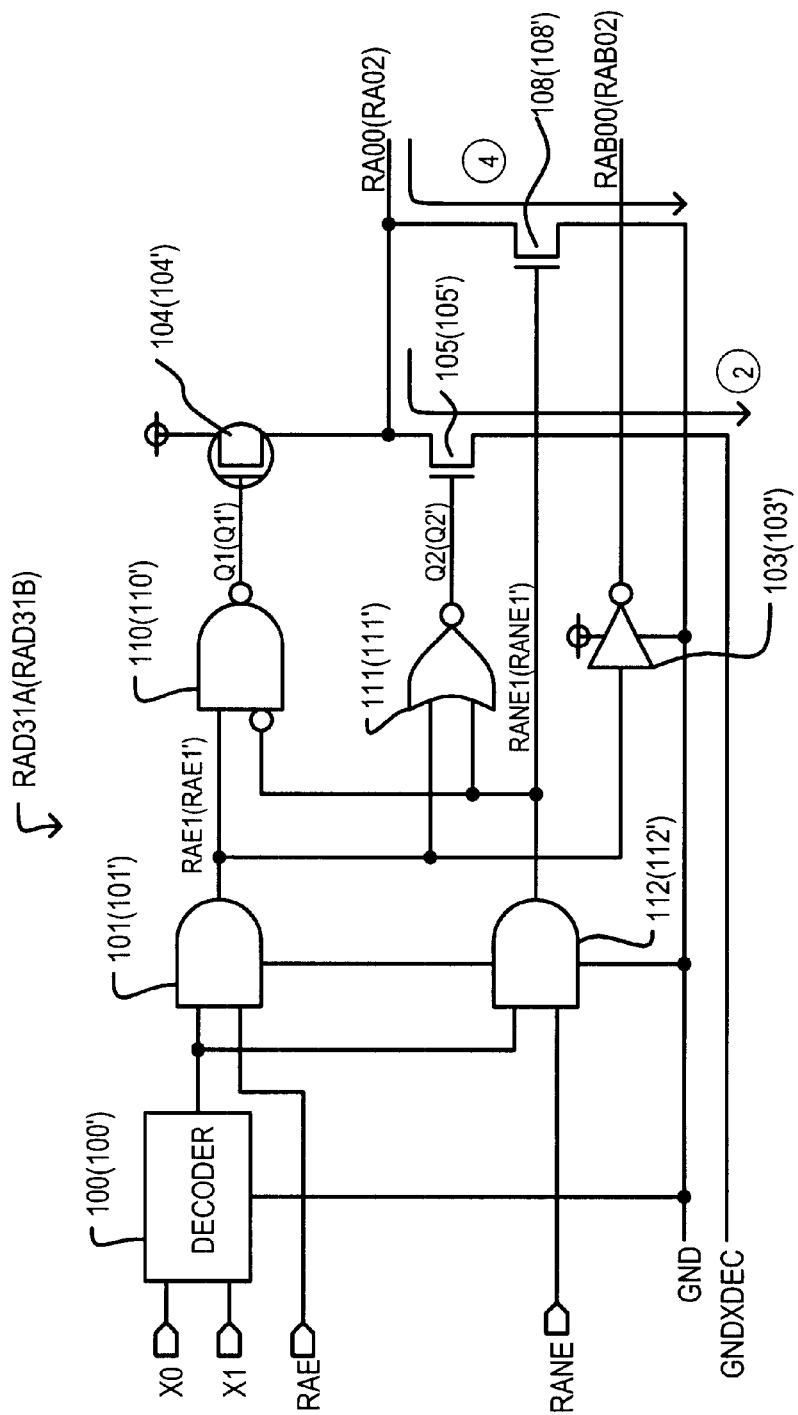
FIG. 17 is a circuit schematic diagram of a RA driver according to an embodiment.
Figure 18:
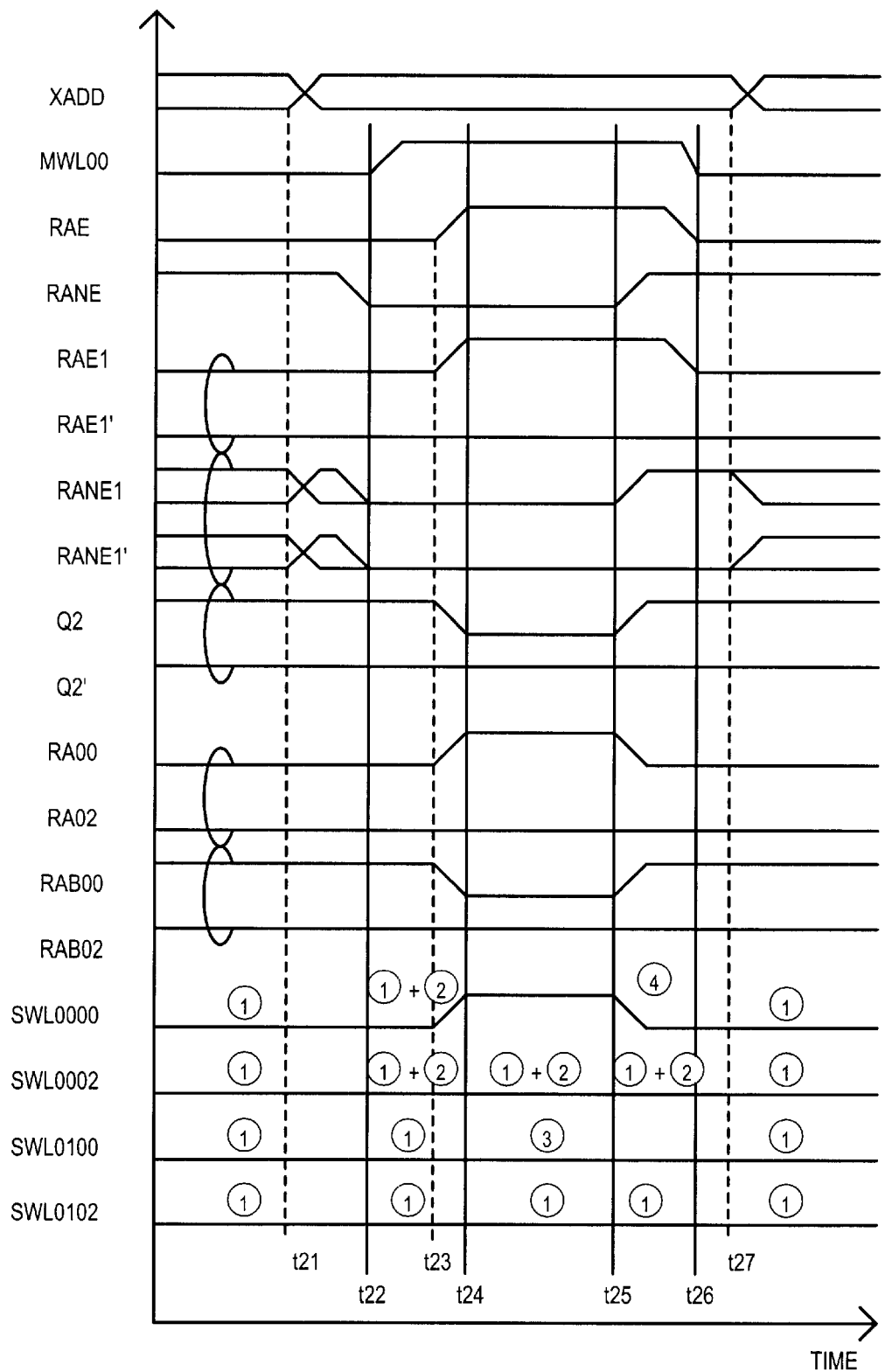
FIG. 18 is a timing diagram illustrating current paths to and from sub-word lines during an access cycle according to an embodiment.

Another embodiment of the present invention is illustrated in FIGS. 12, 17, and 18.

The architectural arrangement of the semiconductor memory may be similar to the semiconductor memory illustrated in FIG. 1, except RA drivers (RAD31, RAD32, RAD33, RAD34, and RAD35) may be used.

Referring now to FIG. 12, in the embodiment of FIGS. 17 and 18, RA driver RAD31 may be used.

Referring now to FIG. 17, a circuit schematic diagram of RA driver RAD31 according to one embodiment is set forth.

FIG. 17 illustrates RA driver RAD31A, which may generate RA signal RA00 and complementary RA signal RAB00. Also illustrated is RA driver RAD31B, which may generate RA signal RA02 and complementary RA signal RAB02. Reference characters for RA driver RAD31B are illustrated in parenthesis. Collectively, RA drivers (RAD31A and RAD31B) may make up RA driver RAD21 in FIGS. 1 and 12.

RA driver RAD31 may have similar constituents to RA drivers (RAD11 and RAD21), such constituents may be referred to by the same reference character.

RA driver RAD31A may include a decoder 100, AND gates (101 and 112), inverter 103, NOR gate 111, logic gate 110 and transistors (104, 105, and 108). Decoder 100 may receive row addresses (X0 and X1) as inputs and generate an output received at an input of AND gates (101 and 112). AND gate 101 may receive control signal RAE at another input and provide an output (RAE1) to the inputs of inverter 103, logic gate 110, and NOR gate 111. Inverter 103 may provide complementary RA signal RAB00 as an output. AND gate 112 may receive control signal RANE at an input and may have an output (RANE1) connected to an input of logic gate 110, NOR gate 111, and a control gate of transistor 108. Logic gate 110 may have an output (Q1) connected to a gate of transistor 104. Transistor 104 may have a source connected to a boosted power supply potential and a drain connected to RA signal RA00. NOR gate 111 may have an output (Q2) connected to a gate of transistor 105. Transistor 105 may have a drain connected to RA signal RA00 and a source connected word line ground potential GNDXDEC. Transistor 108 may have a source connected to peripheral ground GND and a drain connected to RA signal RA00. Transistor 104 may be a p-type IGFET. Transistors (105 and 108) may be n-type IGFETs.

A peripheral ground potential GND may be connected as a ground for decoder 100, AND gates (101 and 112), logic gate 110, NOR gate 111, and inverter 103.

The functionality of RA driver RAD31A will now be described.

When control signal RAE is low, the output (RAE1) of AND gate 101 may be low. With the output of AND gate 101 low, inverter 103 may apply a high output to complementary RA signal RAB00. Logic gate 110 may apply a high to the gate of transistor 104, thus transistor 104 may be turned off. If control signal RANE is low, the output (RANE1) of AND gate 112 may be low and transistor 108 may be turned off. Also, NOR gate 111 may apply a high to the gate of transistor 105 and transistor 105 will turn on. RA signal RA00 may be pulled low through current path 2. If control signal RANE is high and the output of decoder 100 is low, AND gate 112 may provide an output (RANE1) having a logic low. In this case, transistor 108 may be turned off and transistor 105 may be turned on and RA signal RA00 may be pulled low through current path 2. However, if control signal RANE is high and the output of decoder 100 is high, transistor 108 may be turned on and may pull RA signal RA00 low through current path 4. Also, NOR gate 111 may apply a low to the gate of transistor 105 and transistor 105 may be turned off.

When control signal RAE is high, and row addresses (X1, X0) are in a select state, which for decoder 100 of RA driver RAD31A may be {low, low}, then the output of decoder 100 may become high. With the output of decoder 100 high and control signal RAE high, the output (RAE1) of AND gate 101 may become high. With the output (RAE1) of AND gate 101 high, inverter 103 may generate a low complementary RA signal RAB00. When control signal RAE is high, control signal RANE may be low. In this way, the output (RANE1) of AND gate 112 may be low and NOR gate 111 may operate as an inverter with respect to the output of AND gate 101. With the output (RANE1) of AND gate 112 low, transistor 108 may be turned off. With the output of AND gate 101 high and the output (RANE1) of AND gate 112 low, logic gate 110 may apply a low signal to the gate of transistor 104, thus transistor 104 may be turned on. NOR gate 111 may apply a low signal to the gate of transistor 105, thus transistor 105 may be turned off. With transistor 104 turned on and transistors (105 and 108) turned off, RA signal RA00 may be pulled to a boosted high potential. Thus, RA signal RA00 may be high and complementary RA signal may be low.

If control signal RAE is high and RA driver RAD11A receives row addresses (X1, X0) having a value other than {low, low}, then the output of decoder 100 may be low. With the output of decoder 100 low, the output of AND gate 101 may be low. Thus inverter 103 may apply a boosted potential to complementary RA signal RAB00 and complementary RA signal RAB00 may be high. Logic gate 110 may apply a boosted potential (high level) to the gate of transistor 104. Thus, transistor 104 may be turned off. If control signal RANE is high and the output of decoder 100 is high, the output (RANE1) of AND gate 112 may be high. Thus, transistor 108 may be turned on and may pull RA signal RA00 low through current path 4. Also, NOR gate 111 may apply a low to the gate of transistor 105 (Q2) and transistor 105 may be turned off. If control signal RANE is high and the output of decoder 100 is low, the output (RANE1) of AND gate 112 may be low. Thus, transistor 108 may be turned off. The output (Q2) of NOR gate 111 may be high. Thus, transistor 105 may be turned on and may pull RA signal RA00 low through current path 2. If control signal RANE is low, the output (RANE1) of AND gate 112 may be low and transistor 108 may be turned off. Also, NOR gate 111 may apply a high to the gate (Q2) of transistor 105 and transistor 105 will turn on. RA signal RA00 may be pulled low through current path 2.

In order to sink sufficient current to discharge RA signal RA00, transistor 108 may be relatively large as compared to other transistors, such as transistor 105. Also transistor 108 may be relatively large compared to transistor T4 illustrated in sub-decoder block SB0000 illustrated in FIG. 12.

Transistor 108 may be conceptualized as a discharge device, in which a discharge current path 4 may be provided.

In this way, transistor 108 may sink current that may be used to switch a sub-word line SWL from high to low. Transistor 108 may have a gate width that may provide sufficient current sinking capabilities to switch a sub-word line SWL from a high to a low in a required minimum time. This may allow a sub-word line to change from a boosted potential level to the low (ground) level at a high speed at the end of a memory cell access cycle.

A control circuit (not shown) may generate control signals (RAE and RANE). Control signal RANE may transition from a high to a low a predetermined time period after a row address XADD is received. Control signal RAE may transition from a low to high a predetermined time period after control signal RANE transitions to low. Control signal RAE may transition back low and control signal RANE may transition back high at the end of an access cycle.

The output (RANE1) of AND gate 112 may have a boosted potential when high. In this way, transistor 108 may receive a boosted potential at a control gate when enabled, which may provide a lower impedance path and increase current capabilities, as compared to a non-boosted potential being received at a control gate.

Transistors (T4 and 105) may be conceptualized as holding devices, in which a current path 2 is provided that may hold unselected sub-word lines SWL clamped to a ground level. Thus, transistors (T4 and 105) may not need large current sinking capabilities. With smaller device sizes, transistors (T4 and 105) may provide sufficient current capabilities to keep unselected sub-word lines SWL clamped to a ground level while suppressing noise generated within the peripheral ground potential GND. In particular, transistors (T4 and 105) may suppress noise created by current spikes. In this case, the ground level may be the word line ground potential GNDXDEC.

Referring once again to FIG. 12 in conjunction with FIG. 17, when transistor T2 within sub-decoder block SB0000 is turned on (main word line MWL00 is high) and control signal RANE and the output of decoder 100 are both high, transistor 108 may be turned on and RA signal RA00 may be electrically connected with peripheral ground GND. In this case, current path 4 may be used to remove charge from sub-word line SWL0000.

When control signal RAE is high, control signal RANE is low, and row addresses (X1, X0) have a value {low, low}, then RA driver RAD31A may output a RA signal RA00 having a high level and complementary RA signal RAB00 having a low level.

When control signal RAE is high, control signal RANE is low, and row addresses (X1, X0) do not have a value {low, low}, then RA driver RAD31A may output a RA signal RA00 having a low level and complementary RA signal RAB00 having a high level.

FIG. 17 also illustrates a circuit schematic diagram of RA driver RAD31B. The general reference characters for RA driver RAD31B are illustrated in parenthesis. RA driver RAD31B may be constructed in the same general manner as RA driver RAD31A. RA driver RAD31B may operate in the same general manner as RA driver RAD31A except decoder 100' may be enabled to output a logic high when row addresses (X1, X0) have the value of {low, high}, respectively.

As previously mentioned, RA drivers (RAD31A and RAD31B) may collectively make up RA driver RAD31 in FIG. 12.

Referring now to FIG. 1, illustrated in parenthesis, RA drivers (RAD31, RAD32, RAD33, RAD34, and RAD35) according to the embodiment of FIG. 17 are illustrated in a semiconductor memory device such as DRAM 10.

RA drivers (RAD32, RAD33, RAD34, and RAD35) may have similar circuit construction to RA driver RAD31.

Referring once again to FIG. 12, it can be noted that wiring providing peripheral ground potential GND and wiring providing word line ground potential GNCXDEC may be electrically connected through separate wirings to the same ground pad GND PAD. Wiring providing word line ground potential GNCXDEC may have a wiring resistance R1. Wiring providing peripheral ground GND may have a wiring resistance R2. Potential variations within the respective wirings may be separated due to wiring resistance R1 and wiring resistance R2.

Discharge current may primarily flow through peripheral ground GND through current path 4. Such discharge current may include, discharging sub-word line SWL0000 capacitance, diffusion capacitance of transistors (T2 and T4), gate capacitance of transistor T3, capacitance of RA signal RA00, etc. By providing the separate wirings, noise caused by discharging a sub-word line SWL0000 on peripheral ground GND may be isolated from word line ground GNDXDEC. This may reduce noise on unselected sub-word lines SWL. Although the illustration discusses discharging sub-word line SWL0000, the same may apply to discharging any sub-word line SWL.

In this way, the potential of word line ground GNDXDEC may be prevented from rising when sub-word line SWL0000 is discharged. Thus, the potential of non-selected sub-word lines electrically connected to word line ground GNDXDEC may remain low. Thus, the data in memory cells connected to the non-selected sub-word lines may not be disturbed by leakage induced by an increase in potential of the non-selected sub-word lines.

The operation of the embodiment illustrated in FIGS. 12 and 17 will now be described.

Referring now to FIG. 18, a timing diagram illustrating current paths to and from sub-word lines during an access cycle according to an embodiment is set forth.

The timing diagram of FIG. 18, includes row address XADD, main word line MWL00, control signals (RAE and RANE), outputs (RAE1 and RAE1') of AND gates (101 and 101'), outputs (RANE1 and RANE1') of AND gates (112 and 112'), outputs (Q2 and Q2') of NOR gates (111 and 111'), RA signals (RA00 and RA02), complementary RA signals (RAB00 and RAB02), sub-word line SWL0000, sub-word line SWL0002, sub-word line SWL0100, and sub-word line SWL0102. Row address XADD may correspond to a plurality of row addresses {Xj, . . . , X2, X1, X0} that may be used to select a sub-word line SWL.

Before time t21, row address XADD may have a value that does not select sub-word line SWL0000. Main word line MWL00 may be low. Control signal RAE may be low. Control signal RANE may be high. RA signal RA00 may be low. Complementary RA signal RAB00 may be high. Sub-word lines (SWL0000, SWL0002, SWL0100, and SWL0102) may all be in the non-selected state (low) and may be at the ground potential.

At this time, because complementary RA signals (RAB00 and RAB02) are high, transistor T4 (FIG. 12) within sub-decoder blocks SB may be turned on and sub-word lines (SWL0000, SWL0002, SWL0100, and SWL0102) may be clamped low by current path 1.

At time t21, row address XADD may change to a value that corresponds to the selection of sub-word line SWL0000.

After a propagation delay, at time t22, row decoder XDEC1 may activate main word line MWL00. Thus, at time t22, main word line MWL00 may transition to a high potential. The high potential may be a boosted high potential. Also, around time t22 (a predetermined delay time from the change of row address signal XADD), a control circuit (not shown) may bring control signal RANE from a high level to a low level.

At this time, because complementary RA signals (RAB00 and RAB02) are high, transistor T4 (FIG. 12) within sub-decoder blocks SB may be turned on and sub-word lines (SWL0000, SWL0002, SWL0100, and SWL0102) may be clamped low by current path 1. However, because main word line MWL00 is high and RA signals (RA00 and RA02) are low, transistor T2 within sub-decoder blocks (SB0000 and SB0002) may be turned on. Also, because control signals (RANE and RAE) are low, current paths 2 within RA drivers (RAD31A and RAD31B) are turned on. Thus, sub-word lines (SWL0000 and SWL00002) may also be clamped low by current path 2.

After a predetermined delay time from the low transition of control signal RANE, a control circuit (not shown) may bring control signal RAE from a low level to a high level. This is illustrated at time t23.

When control signal RAE becomes high, RA driver RAD31 may provide a high RA signal RA00 and a low complementary RA signal RAB00. RA signal RA00 may be at a boosted potential. With RA signal RA00 high, sub-word line SWL0000 may be driven high (to a boosted potential) through transistor T2 within sub-decoder block SB0000. This is illustrated at time t24.

With sub-word line SWL0000 at a high level, memory cell M1 may be accessed and data stored may be output to bit line BT2.

Because main word line MWL01 is low, RA signal RA00 is high, and complementary RA signal RAB00 is low, transistors (T2 and T4) may be turned off within sub-word block SB0100 and transistor T3 may be turned on. In this way, current path 3 may be enabled to clamp sub-word line SWL0100 at a low level.

After a predetermined time (time t25), based on the maximum time required to access a memory cell, the control circuit (not shown) may drive control signal RANE high. It is noted that control signal RAE may remain high at this time.

With control signal RANE remaining high, the output (RAE1) of AND gate 101 may remain high, thus complementary RA signal RAB00 may remain low. However, with control signal RANE high and the output of decoder 100 high, the output (RANE1) of AND gate 112 may become high, which may turn on transistor 108. With the output (RANE1) of AND gate 112 high, the output (Q1) of logic gate 110 may become high and transistor 104 may off. Thus, RA signal RA00 may become low. Thus, within RA driver RAD31A, current path 4 may be turned on.

Because complementary RA signal RAB00 remains low, current path 1 within sub-block SWL0000 remains off. Therefore, when RA signal RA00 transitions low, sub-word line SWL0000 may be discharged through current path 4 only. All the discharge current may flow through current path 4. In this way, switching noise may occur on peripheral ground GND while being minimized on word line ground GNDXDEC.

Within RA driver RAD31B, transistor 106' may remain turned on and sub-word line SWL0002 may remain clamped to the low level by current paths (1 and 2). In this way, sub-word line SWL0002 may remain isolated from noise on peripheral ground GND.

Because RA signal RA00 is low, transistor T3 within sub-block decoder SB0100 may turn off and current path 3 may be disabled. However, because the time between time t25 and t26 is very short, the potential of sub-word line SWL0100 may be unaffected.

Sub-word line SWL0102 may still be maintained at a low potential through current path 1 through sub-block decoder SB0102.

A predetermined time period (time t26) after control signal RANE goes high, a control circuit (not shown) may drive control signal RAE low. Also, at this time main word line MWL00 may return low. With main word line MWL00 low, transistor T2 within sub-block decoders (SB0000 and SB0002) may be turned off. Thus, current may not flow from sub-word lines (SWL0000 and SWL0002) through RA signals (RA00 and RA02), respectively. However, with control signal RAE low, within RA driver RAD31A, the output (RAE1) of AND gate 101 may transition low. Thus, complementary RA signal RAB00 may transition high. With complementary RA signals (RAB00 and RAB02) high, transistors T4, within sub-block decoders (SB0000, SB0002, SB0100, and SB0102) may be turned on. In this way, sub-word lines (SWL0000, SWL0002, SWL0100, and SWL0102) may be clamped low by current path 1.

At time t27, row address may change to a status corresponding to an address where neither main word line MWL00 or main word line MWL01 is active.

Within each sub-decoder block SB, transistor T2 may have a large current capacity (as compared to, for example, transistor T4) in order to allow the respective sub-word line SWL to rapidly rise. Transistor T2 may also be used in the discharge current path to allow SWL to rapidly fall. In this way access time may be achieved at a high speed.

In the embodiment illustrated in FIGS. 12, 17, and 18, the discharge current may flow to peripheral ground GND through current path 4. In this way, peripheral ground GND may receive current while word line ground GNDXDEC may remain "quiet". Thus by clamping non-selected word lines (SWL0002, SWL0100, and SWL0102) to word line ground GNDXDEC, non-selected sub-word lines (SWL0002, SWL0100, and SWL0102) may not be adversely affected.

By using the embodiment illustrated in FIGS. 12, 17, and 18, noise spikes on ground lines caused by discharging selected word lines may be reduced so that non-selected word lines may not be affected. This may reduce adverse affects to data integrity.

In the embodiments disclosed, a selected sub-word line SWL may be deactivated prior to a change in a row address XADD. In order to improve cycle time, it may be necessary to precharge internal signal lines in preparation for the next active cycle. Thus, a sub-word line SWL may only stay activated for a predetermined time period required to implement the desired operation (for example, read, write, or refresh).

Row decoder XDEC may select a group of sub-word decoder blocks SB by activating a main word line MWL connected to the group. RA drivers RAD may be conceptualized as decoders that may select one sub-word decoder block SB from a group of sub-word decoder blocks SB by activating a RA signal connected to a sub-word decoder block SB within the group.

It is understood that the embodiments described above are exemplary and the present invention should not be limited to those embodiments. Specific structures should not be limited to the described embodiments.

For example, it may not be necessary that main word lines be divided into sub-word lines. The embodiments may also be applicable to the case in which main word lines are directly connected to a row of memory cells. In that case, the word line may be discharged to a noisy ground while the non-selected word lines may remain electrically connected to a "quiet" ground, as just one example.

Peripheral ground GND and word line ground GNDX-DEC may be connected to different bond pads. The different bond pads may be connected together by wiring within the lead frame, as just one example. In this way, wiring within the lead frames may serve to increase resistance between peripheral ground GND and word line ground GNDXDEC and may reduce noise.

Although a boosted power supply potential is employed for selected signals. It may also be possible to employ a power supply that is not boosted. Power supplies may be internally regulated or provided external to the chip, as just two examples.

N-type IGFETs and p-type IGFETs may be metal-oxide-semiconductor (MOS) FETs, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a plurality of word lines, each word line coupled to a plurality of memory cells; and
   a decoder circuit coupled to a predetermined word line and providing an electrical connection between a first ground line and the predetermined word line when the predetermined word line is not selected and providing an electrical connection between a second ground line and the predetermined word line when the predetermined word line is deactivated.

2. The semiconductor memory device according to claim 1, wherein:
   the decoder circuit includes a first transistor providing the electrical connection between the predetermined word line and the first ground line and a second transistor providing the electrical connection between the predetermined word line and the second ground line.

3. The semiconductor memory device according to claim 2, wherein:
   a current capacity of the second transistor is larger than a current capacity of the first transistor.

4. The semiconductor memory device according to claim 2, wherein the second transistor is an insulated gate field effect transistor (IGFET).

5. The semiconductor memory device according to claim 4, wherein when the predetermined word line is deactivated, the second transistor is controlled with a boosted potential.

6. The semiconductor memory device according to claim 1, wherein:
   the plurality of word lines includes a plurality of main word lines, each main word line divided into a plurality of sub-word lines; and
   the decoder circuit provides the electrical connections between the first and second ground lines and a predetermined sub-word line.

7. The semiconductor memory device according to claim 1, wherein:
   a value of an internal row address activates the predetermined word line and the predetermined word line is deactivated prior to a subsequent change in the value of the internal row address.

8. A method of accessing a memory cell of a semiconductor memory device, comprising the steps of:
   activating a first word line electrically connected with a gate of an access transistor of a memory cell;
   keeping a second word line unactivated by providing a first holding current path to a first ground line; and
   deactivating the first word line by providing a first discharge current path to a second ground line.

9. The method according to claim 8, wherein the first holding current path has a smaller current capacity than the first discharge current path.

10. The method according to claim 8, wherein:
    the first word line has a second holding current path when unactivated; and
    the second holding current path is disabled when the first discharge current path is enabled.

11. The method according to claim 8, wherein the first discharge current path includes an insulated gate field effect transistor (IGFET) having an impedance path coupled between the first word line and the second ground line.

12. The method according to claim 11, wherein:
    deactivating the first word line includes applying a boosted voltage to the gate of the IGFET.

13. The method according to claim 8, wherein the step of activating a first word line includes:
    activating a first main word line coupled to a first group of word lines and activating the first word line from the first group of word lines.

14. The method according to claim 8, wherein:
    the step of activating the first word line includes internally receiving a row address; and
    the step of deactivating the first word line is prior to internally receiving a subsequent row address.

15. A semiconductor memory device, comprising:
    a first word line having an activated state and an unactivated state;
    a second word line having an activated state and an unactivated state; and
    a decoder circuit providing a discharge current path to a first ground line when the first word line transitions from the activated state to the unactivated state and a holding current path to a second ground line when the second word line is in the activated state.

16. The semiconductor memory device according to claim 15, wherein:
    the decoder circuit receives a control signal having a discharge current path enable state and a discharge current path disable state; and
    the control signal is in the discharge current path disable state when the first word line is in the activated state.

17. The semiconductor memory device according to claim 16, wherein the holding current path is disabled when the control signal is in the discharge current path enable state.

18. The semiconductor memory device according to claim 15, further including:
    a first control signal having an enable state and a disable state;
    the decoder circuit includes an address decode portion providing a decode signal having a decode select state when a received address has a predetermined value and a decode unselected state when the received address does not have the predetermined value; and the holding current path is disabled when the first control signal has the enable state and the decode signal has the first decode state.

19. The semiconductor memory device according to claim 18, wherein:

the discharge current path is disabled when the decode signal has the decode unselected state.

20. The semiconductor memory device according to claim 19, further including:

a second control signal having a second control enable state and a second control disable state; and the discharge current path is enabled when the second control signal has the second control signal enable state and the decode signal has the decode enable state.

* * * * *